(12) United States Patent
Filatau

(10) Patent No.: US 12,274,029 B2
(45) Date of Patent: Apr. 8, 2025

(54) COOLING DEVICE

(71) Applicant: Huawei Digital Power Technologies Co., Ltd., Shenzhen (CN)

(72) Inventor: Sviataslau Alehavich Filatau, Minsk (BY)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 545 days.

(21) Appl. No.: 17/537,934

(22) Filed: Nov. 30, 2021

(65) Prior Publication Data

US 2022/0369509 A1 Nov. 17, 2022

Related U.S. Application Data

(63) Continuation of application No. PCT/BY2021/000006, filed on May 12, 2021.

(51) Int. Cl.
*H05K 7/20* (2006.01)
*F25B 5/04* (2006.01)
(Continued)

(52) U.S. Cl.
CPC .......... *H05K 7/20309* (2013.01); *F25B 5/04* (2013.01); *F25B 25/00* (2013.01); *F25B 39/02* (2013.01); *F25B 39/04* (2013.01); *F25B 41/20* (2021.01); *F25B 41/42* (2021.01); *F28D 1/05316* (2013.01); *F28D 1/05366* (2013.01); *F28F 9/0273* (2013.01); *H05K 7/20318* (2013.01); *H05K 7/20327* (2013.01); *H05K 7/20818* (2013.01); *H05K 7/20827* (2013.01);
(Continued)

(58) Field of Classification Search
CPC .. F25B 5/04; F25B 25/00; F25B 39/02; F25B 39/04; F25B 41/20; F25B 41/42; F25B 2400/0401; F25B 2400/0411; F28D 1/05316; F28D 1/05366; F28F 9/0273; H05K 7/20309; H05K 7/20318; H05K 7/20327; H05K 7/20818; H05K 7/20827
See application file for complete search history.

(56) References Cited

U.S. PATENT DOCUMENTS 5,056,324 A * 10/1991 Haley ..................... F25B 41/20
62/174
5,906,104 A * 5/1999 Schwartz .................. F25B 6/02
62/238.7
(Continued)

FOREIGN PATENT DOCUMENTS

CN 107152890 B * 1/2019 ............... F25B 1/00
CN 104976838 B 4/2019
(Continued)

*Primary Examiner* — Ljiljana V. Ciric
(74) *Attorney, Agent, or Firm* — WOMBLE BOND DICKINSON (US) LLP

(57) ABSTRACT

A cooling device includes a cooling circuit including a compressor to compress cooling agent in the cooling circuit during an active cooling mode; a condensing unit connected to the compressor by a first fluid line of the cooling circuit; and an evaporator including a top part, a bottom part, and a plurality of evaporating tubes connecting the top part with the bottom part. The top part is connected to the condensing unit by a second fluid line of the cooling circuit, and the bottom part is connected to the compressor by a third fluid line of the cooling circuit.

20 Claims, 19 Drawing Sheets

(51) Int. Cl.
  *F25B 25/00* (2006.01)
  *F25B 39/02* (2006.01)
  *F25B 39/04* (2006.01)
  *F25B 41/20* (2021.01)
  *F25B 41/42* (2021.01)
  *F28D 1/053* (2006.01)
  *F28F 9/02* (2006.01)

(52) U.S. Cl.
  CPC ............... *F25B 2400/0401* (2013.01); *F25B 2400/0411* (2013.01)

(56) References Cited

U.S. PATENT DOCUMENTS

| | | | |
|---|---|---|---|
| 6,023,935 A | 2/2000 | Okazaki et al. | |
| 6,347,528 B1 * | 2/2002 | Iritani | B60H 1/3207 62/434 |
| 6,708,510 B2 * | 3/2004 | Sulc | F25B 41/20 62/278 |
| 6,775,996 B2 * | 8/2004 | Cowans | B23Q 11/143 62/201 |
| 6,837,063 B1 | 1/2005 | Hood, III et al. | |
| 6,938,438 B2 * | 9/2005 | Lifson | F25B 41/24 62/196.1 |
| 9,499,026 B2 * | 11/2016 | Brodie | B60H 1/00907 |
| 9,862,251 B2 * | 1/2018 | Brodie | B60H 1/00335 |
| 9,909,790 B2 * | 3/2018 | Pham | F25B 25/00 |
| 9,968,013 B2 | 5/2018 | Cacho Alonso | |
| 10,254,028 B2 * | 4/2019 | Lin | F25B 25/00 |
| 10,292,303 B2 | 5/2019 | Cacho Alonso et al. | |
| 10,571,159 B2 * | 2/2020 | Saito | F25B 49/02 |
| 11,761,686 B2 * | 9/2023 | Pham | F25B 25/00 62/185 |
| 11,959,684 B2 * | 4/2024 | Filatau | F25B 39/00 |
| 2009/0205350 A1 * | 8/2009 | Takahashi | F25B 41/30 62/335 |
| 2018/0156505 A1 * | 6/2018 | Pham | F25B 25/00 |
| 2019/0047363 A1 * | 2/2019 | Sonnekalb | B60H 1/00371 |
| 2019/0178546 A1 * | 6/2019 | Lin | F25B 41/20 |
| 2020/0329585 A1 | 10/2020 | Fuller et al. | |
| 2022/0364769 A1 * | 11/2022 | Filatau | F25B 39/00 |
| 2022/0369509 A1 * | 11/2022 | Filatau | H05K 7/20818 |
| 2024/0085073 A1 * | 3/2024 | Filatau | F25B 25/00 |

FOREIGN PATENT DOCUMENTS

| | | | |
|---|---|---|---|
| CN | 110030752 A | 7/2019 | |
| DE | 60031808 T2 * | 9/2007 | ......... B60H 1/00342 |
| DE | 102015105500 B3 | 9/2016 | |
| EP | 1072453 A2 * | 1/2001 | ......... B60H 1/00342 |
| EP | 2090852 A2 * | 8/2009 | ......... B60H 1/00878 |
| EP | 2400242 A1 | 12/2011 | |
| EP | 3722720 A1 | 10/2020 | |
| EP | 3723461 A1 | 10/2020 | |
| KR | 20080079957 A | 9/2008 | |
| KR | 101955997 B1 | 3/2019 | |
| WO | 2003095906 | 11/2003 | |
| WO | 2009038552 A1 | 3/2009 | |
| WO | 2015193952 A1 | 12/2015 | |
| WO | 2016103593 A1 | 6/2016 | |
| WO | 2020176746 A1 | 9/2020 | |

\* cited by examiner (A)

(B)

COOLING DEVICE

CROSS-REFERENCE TO RELATED APPLICATIONS

This application is a continuation of International Application No. PCT/BY2021/000006, filed on May 12, 2021, the disclosure of which is hereby incorporated by reference in its entirety.

TECHNICAL FIELD

The disclosure relates to a cooling device. More specifically, the disclosure relates to a cooling device comprising a cooling circuit as well as to a method for cooling by using a cooling circuit of a cooling device, and in particular to a cooling device configured to operate in an active and a passive cooling mode.

BACKGROUND

A cooling device comprising a cooling circuit is commonly used, for example in heating, ventilation, and air conditioning devices (HVAC), to reduce the temperature in a room and/or a cabinet. During an active cooling mode of such cooling device, the flow of cooling agent within the cooling circuit is driven by a compressor of the cooling circuit, which compresses the cooling agent. Such a compressor can be an oil-lubricated compressor, wherein lubricant oil is used to lubricate moving parts of the compressor.

During a passive cooling mode, the compressor can be switched off for energy saving, and the flow of cooling agent within the cooling circuit is driven by the force of gravity according to the principle of a loop thermosiphon.

However, during an active cooling mode in commonly used cooling devices lubricant oil is adapted to be transferred together with the compressed cooling agent to elements of the cooling circuit, which are located downstream of the compressor, for example to a condensing unit, an expansion device, and/or an evaporator of the cooling circuit. The transferred lubricant oil might be deposited within said elements, for example within the condensing unit and/or evaporator and might therefore reduce the efficiency of heat exchange performed by condensing unit and/or evaporator, and for example within the expansion device and might therefore block the flow of cooling agent through the expansion device.

Lubricant oil is hereby dissolved in the liquid phase of the cooling agent, which leads to an increase of viscosity. The flow of liquid cooling agent with increased viscosity leads to significantly increasing the flow resistance of said liquid cooling agent. This phenomenon mostly affects the operation of the cooling device during a passive cooling mode. If the content of lubricant oil at the condensing unit, evaporator and the corresponding connecting tubes is high, the force of gravity could be not enough to support the circulation of cooling agent during the passive cooling mode, and thereby the thermal performance of such passive cooling mode is very limited.

In conventional cooling devices oil separating elements can be used, in order to separate lubricant oil from the cooling agent circulating in the cooling circuit. For example, in U.S. Pat. No. 6,023,935 A such an oil separating element is disclosed.

However, conventional oil separating elements are not able to separate 100% of lubricant oil from the cooling agent, and thereby lubricant oil can migrate and can be retained at heat exchangers, especially at the evaporator. Conventional evaporators of cooling devices with active cooling mode of operation are designed with a reduced flow cross section in order to achieve a high flow velocity of the mixture of cooling agent and lubricant oil, so a high speed stream of gaseous cooling agent can push retained lubricant oil towards the compressor. But evaporators with a reduced flow cross section are not applicable to cooling devices with a passive cooling mode of operation, because in the passive cooling mode the force of gravity is not enough to overcome the flow resistance of channels, which reduces the flow cross section.

Replacing of the evaporator with a reduced flow cross section by an evaporator with a large flow cross section is suitable for operation of cooling device with a passive cooling mode of operation, but the flow velocity of cooling agent is decreased, so the low speed stream of gaseous cooling agent at the evaporator cannot push the lubricant oil towards the compressor, and thereby lubricant oil is retained at the evaporator and can affect the thermal performance of the passive cooling mode due to increasing of the viscosity of cooling agent.

Therefore, it would be desirable to have a cooling device that alleviates the problems of the prior art.

SUMMARY

It is an objective of the disclosure to provide a cooling device with the ability to operate during an active cooling mode and a passive cooling mode, said cooling device comprising a cooling circuit as well as a method for cooling by using a cooling circuit of a cooling device, wherein the cooling device and the method for cooling are configured such that the removal of lubricant oil is possible from the evaporator of the cooling device, and that the evaporator is suitable for operation in a passive cooling mode due to a low pressure drop, which reduces the flow cross section.

The foregoing and other objectives are achieved by the subject matter of the independent claims. Further implementation forms are apparent from the dependent claims, the description, and the figures.

According to a first aspect a cooling device comprising a cooling circuit is provided, the cooling circuit comprising a compressor, which is adapted to compress cooling agent in the cooling circuit during an active cooling mode, wherein the compressed cooling agent contains lubricant oil from the compressor; a condensing unit, which is connected to the compressor by a first fluid line of the cooling circuit; an evaporator, which comprises a top part, a bottom part, and a plurality of evaporating tubes connecting the top part with the bottom part, wherein the top part is connected to the condensing unit by a second fluid line of the cooling circuit, and wherein the bottom part is connected to the compressor by a third fluid line of the cooling circuit, the cooling device configured so that during the active cooling mode, the lubricant oil is adapted to be transferred from the compressor through the condensing unit, through the evaporator, and through the third fluid line back to the compressor; a first fluid by-pass line, which connects the condensing unit with the bottom part of the evaporator; and a second fluid by-pass line, which connects the top part of the evaporator with the condensing unit, wherein the first fluid by-pass line comprises a first by-pass valve and wherein the second fluid by-pass line comprises a second by-pass valve, wherein the first by-pass valve and the second by-pass valve are adapted to close the first fluid by-pass line and the second fluid by-pass line in the active cooling mode, respectively.

Therefore, the technical advantage is achieved that the lubricant oil, which is adapted to be released from the compressor together with the compressed cooling agent, is recycled back to the compressor through the first fluid line, through the condensing unit, through the second fluid line, through the evaporator and through the third fluid line. Thereby, the formation of any disadvantageous deposits of lubricant oil within the condensing unit and/or within the evaporator is prevented or at least significantly reduced.

In an embodiment, liquid cooling agent with the lubricant oil dissolved therein is adapted to enter the top part of the evaporator, and is adapted to subsequently flow through the plurality of evaporating tubes into the bottom part of the evaporator. During evaporation of the liquid cooling agent in the evaporator, in particular in the evaporating tubes, a phase separation between the liquid lubricant oil and the obtained gaseous cooling agent is observed. The flow of the liquid lubricant oil within the evaporator from the top part to the bottom part is facilitated by the force of gravity and by the pressure, which is applied to the liquid lubricant oil by the gaseous cooling agent, so that the obtained lubricant oil is effectively flushed out of the bottom part of the evaporator and into the third fluid line, and through the third fluid line back to compressor.

Therefore, the lubricant oil released by the compressor is continuously recycled back to the compressor. Moreover, the first fluid by-pass line, which directly connects the condensing unit with the evaporator, bypasses the second fluid line, and the second fluid by-pass line, which directly connects the evaporator with the condensing unit, functions as a by-pass in respect to the compressor in a passive cooling mode, wherein in the passive cooling mode the compressor is adapted to be deactivated and the circulation of cooling agent within the cooling circuit is driven by a reduced ambient temperature and gravitational forces according to the principle of a loop thermosiphon.

In an embodiment, the cooling device is not limited to any specific cooling application, but is adapted to cool any media, for example ambient air, liquid from an additional cooling circuit of another cooling device, a solid element, which generates heat, or any other solid or liquid material. Therefore, a cooling device according to the disclosure may comprise heating, ventilation, and air conditioning devices (HVAC). In an embodiment, the cooling device according to a possible implementation form is adapted to cool a cabinet, for example a server cabinet, for example by directly cooling servers within said server cabinet or for example by cooling air within said server cabinet thereby indirectly cooling the servers.

In an embodiment, the cooling agent in the cooling circuit may comprise any conventionally used cooling agent, for example water, isobutane, tetrafluorethane and the like. In an embodiment, the cooling agent can be present in the cooling circuit in two phases, for example in a liquid and in a gaseous phase. At lower temperatures and/or higher pressure the cooling agent is typically present in the liquid phase, while at higher temperatures and/or lower pressure, the cooling agent is typically present in the gaseous state. The cooling agent may be present in the cooling circuit as a mixture of liquid and gaseous phase.

In an embodiment, the compressor is positioned in the cooling circuit downstream of the evaporator. In an embodiment, the compressor is adapted to compress gaseous cooling agent in the cooling circuit during the active cooling mode.

In an embodiment, the active cooling mode is characterized in that the compressor is activated and is adapted to compress gaseous cooling agent, which results in an increase of temperature of the cooling agent and in a pressure gradient within the cooling circuit, which pressure gradient drives the circulation of cooling agent within the cooling circuit, and which pressure gradient is generated by active work performed by the compressor.

In an embodiment the compressed gaseous cooling agent contains liquid droplets of lubricant oil, wherein in an embodiment the gaseous cooling agent and liquid droplets of lubricant oil form a two-phase mixture which is adapted to be transferred from the compressor through the first fluid line to condensing unit.

In an embodiment, the compressor can be combined with auxiliary components, in particular valves, receivers, liquid separators, oil separators, additional heat exchangers, filters, control units, sensors, and the like.

In an embodiment, the condensing unit is positioned in the cooling circuit downstream of the compressor. In an embodiment, the condensing unit is adapted to condensate the compressed cooling agent, in particular compressed gaseous cooling agent, by dissipating heat from the cooling agent, in order to obtain liquid cooling agent.

In an embodiment, in the condensing unit the liquid droplets of lubricant oil are dissolved in the obtained liquid cooling agent, thereby forming a one-phase mixture, wherein the one-phase mixture of lubricant oil and liquid cooling agent is adapted to be transferred from the condensing unit and through the second fluid line to the evaporator, in particular to the top part of the evaporator.

In an embodiment, the condensing unit comprises at least one condensing tube for conducting the cooling agent through the condensing unit. In an embodiment, the condensing unit may comprise any condensing unit, which is adapted to allow for a condensation of the cooling agent.

In an embodiment, the condensing unit comprises an inlet, which is connected to the first fluid line, and an outlet, which is connected to the second fluid line. In an embodiment, the condensing unit comprises at least one condensing tube or channel, which connects the inlet with the outlet.

In an embodiment, the condensing unit can be combined with auxiliary components, in particular valves, receivers, liquid separators, oil separators, additional heat exchangers, filters, control units, sensors, and the like.

In an embodiment, the condensing unit is formed as a condenser, which comprises a top part, a bottom part, and a plurality of condensing tubes, in particular vertically oriented condensing tubes, wherein said condensing tubes connect the top part with the bottom part.

In an embodiment, the top part, the bottom part, and/or the plurality of condensing tubes are connected to the compressor by the first fluid line. In an embodiment, the first fluid line connects the compressor with the top part of the condenser.

In an embodiment, the top part, the bottom part, and/or the plurality of condensing tubes are connected to the evaporator by the second fluid line. In an embodiment, the second fluid line connects the bottom part of the condenser with the evaporator.

In an embodiment, said heat dissipation from the condensing unit is provided by a flow of ambient air, which temperature is lower than the temperature of the cooling agent entering the condensing unit, to allow for a heat transfer from the cooling agent flowing through the condensing unit to the ambient air.

In an embodiment, the second fluid line comprises an expansion device, which is adapted to expand the liquid cooling agent exiting the condensing unit, in order to obtain expanded liquid cooling agent, wherein the evaporator is adapted to evaporate the expanded liquid cooling agent.

In an embodiment, the evaporator is positioned in the cooling circuit downstream of the condensing unit and upstream of the compressor.

In an embodiment, the evaporator is adapted to evaporate the cooling agent present in a liquid state within the cooling circuit by supplying heat to the cooling agent, in order to obtain gaseous cooling agent and liquid droplets of lubricant oil, thereby forming a two-phase mixture, wherein the two-phase mixture of gaseous cooling agent and liquid droplets of lubricant oil is adapted to be transferred from the evaporator, in particular from the bottom part of the evaporator, through the third fluid line back to the compressor.

In an embodiment said heat supply to the evaporator is provided by a flow of ambient air, which temperature is higher than the temperature of the cooling agent entering the evaporator, to allow for a heat transfer from the ambient air to the cooling agent flowing through the evaporator.

In an embodiment, the evaporator comprises a plurality of vertically oriented evaporating tubes, which connect the bottom part with the top part of the evaporator. In an embodiment, said vertical arrangement is characterized by a vertical axis of the plurality of vertically oriented evaporating tubes, which extends between a bottom housing part of the cooling device and a top housing pat of the cooling device.

In an embodiment, the evaporator can be combined with auxiliary components, in particular valves, receivers, liquid separators, oil separators, additional heat exchangers, filters, control units, sensors, and the like.

In an embodiment, the first and second by-pass valve are formed as a two-way by-pass valve, respectively, either opening the respective by-pass line in the passive cooling mode or closing the respective by-pass line in the active cooling mode.

However, in an embodiment, the second by-pass valve is adapted to at least partially close the second fluid by-pass line in the active cooling mode. Said at least partial closure of the second fluid by-pass line may comprise a complete closure of the second fluid by-pass line by the second by-pass valve, thereby completely sealing off the second fluid by-pass line in the active cooling mode.

Alternatively, said at least partial closure of the second fluid by-pass line may comprise a partial closure of the second fluid by-pass line in the active cooling mode, so that during the active cooling mode lubricant oil, which together with the compressed cooling agent is adapted to flow from the compressor to the condensing unit may be collected in the second fluid by-pass line, thereby reducing the amount of lubricant oil, which is circulated in the cooling circuit.

In an embodiment, said partial closure, e.g. partial opening, of the second fluid by-pass line can be achieved by a periodical opening of the second by-pass valve to allow for a flow of lubricant oil from into the second fluid by-pass line at points in time. Alternatively, in an embodiment, said partial closure, e.g. partial opening, of the fluid by-pass line can be achieved by a constant partial opening of the second fluid by-pass line to allow for a constant flow of lubricant oil into the second fluid by-pass line with a limited flow rate.

Due to the partial closure, e.g. partial opening of the by-pass valve, lubricant oil can flow from the second fluid by-pass line and through the third fluid line to the suction port of the compressor, thereby allowing for an alternative path for a constant return of lubricant oil to the compressor.

In an embodiment of the first aspect, the cooling device is configured so that during the active cooling mode, the lubricant oil is adapted to be transferred from the compressor through the condensing unit, through the top part of the evaporator, through the plurality of evaporating tubes, through the bottom part of the evaporator, and through the third fluid line back to the compressor.

Thereby, the liquid cooling agent with the lubricant oil dissolved therein is adapted to enter the top part of the evaporator, and while being adapted to flow through the plurality of evaporating tubes, the liquid cooling agent is evaporated thereby forming gaseous cooling agent, which results in a phase separation between the formed gaseous cooling agent and the lubricant oil, which maintains its liquid phase.

Since the cooling agent is adapted to flow from the top part of the evaporator through the plurality of evaporating tubes downwards to the bottom part of the evaporator, after the phase separation the lubricant oil is pushed downwards in the plurality of evaporating tubes and out of the bottom part of the evaporator by the force of gravity and by the pressure exerted on the lubricant oil by the flow of the cooling agent. Consequently, no lubricant oil remains in the evaporator.

In an embodiment of the first aspect, in the active cooling mode the compressor is adapted to compress gaseous cooling agent, wherein the compressed gaseous cooling agent is adapted to be conducted together with the lubricant oil through the first fluid line to the condensing unit, wherein the condensing unit is adapted to condensate the compressed gaseous cooling agent, in order to obtain liquid cooling agent, wherein the liquid cooling agent is adapted to be conducted together with the lubricant oil through the second fluid line to the evaporator, wherein the evaporator is adapted to evaporate the liquid cooling agent, in order to obtain the gaseous cooling agent, wherein the gaseous cooling agent is adapted to be conducted together with the lubricant oil through the third fluid line back to the compressor.

In an embodiment, before entering the condensing unit, the gaseous cooling agent together with the liquid lubricant oil is adapted to be present as a two-phase mixture comprising the gaseous cooling agent and the liquid lubricant oil as separate phases.

In an embodiment, after condensation of the gaseous cooling agent in the condensing unit, the lubricant oil is dissolved in the liquid cooling agent, thereby forming a one phase mixture.

In an embodiment, after evaporation in the evaporator, the gaseous cooling agent together with the liquid lubricant oil is present as a two-phase mixture comprising the gaseous cooling agent and the liquid lubricant oil as separate phases.

In an embodiment, the liquid cooling agent is adapted to be conducted together with the lubricant oil from the condensing unit through the second fluid line to the top part of the evaporator, wherein the evaporator is adapted to transfer the liquid cooling agent from the top part of the evaporator through the plurality of evaporating tubes to the bottom part of the evaporator to evaporate the liquid cooling agent, in order to obtain the gaseous cooling agent, wherein the gaseous cooling agent turn is adapted to be conducted together with the lubricant oil through the third fluid line back to the compressor.

In an embodiment of the first aspect, in the active cooling mode the first by-pass valve and the second by-pass valve are adapted to completely close the first fluid by-pass line and the second fluid by-pass line, respectively, or wherein in the active cooling mode the first by-pass valve is adapted to completely close the first fluid by-pass line and the second by-pass valve is adapted to partially close the second fluid by-pass line, by decreasing the cross-section of the second fluid by-pass line between 1% and 99%.

In an embodiment, in the active cooling mode the second by-pass valve is adapted to partially close the second fluid by-pass line by decreasing the cross-section of the fluid by-pass line between 50% and 99%, more particular in a range between 75% and 99%, even more particular in a range between 85% and 99%, and most particular in a range between 95% and 99%.

In an embodiment, in the active cooling mode the second by-pass valve is adapted to partially close the fluid by-pass line by decreasing the cross-section of the fluid by-pass line by 10%, 20%, 30%, 40%, 50%, 60%, 70%, 80%, 90%, 95%, 98% or 99%.

By partially closing, i.e. by partially opening the second fluid by-pass line, during the active cooling mode lubricant oil, which is present in the two-phase mixture flowing from the compressor to the condensing unit, can be collected in the second fluid by-pass line.

In an embodiment of the first aspect, in a passive cooling mode the compressor is adapted to be deactivated, wherein in the passive cooling mode the first by-pass valve and the second by-pass valve are adapted to open the first fluid by-pass line and the second fluid by-pass line, respectively, wherein in the passive cooling mode the cooling agent is adapted to directly flow from the condensing unit through the first fluid by-pass line, through the evaporator, and through the second fluid by-pass line back to the condensing unit.

In an embodiment in the passive cooling mode the cooling agent is adapted to directly flow from the condensing unit through the first fluid by-pass line, through the bottom part of the evaporator, through the plurality of evaporating tubes, through the top part of the evaporator, through the second fluid by-pass line back to the condensing unit.

In an embodiment during the active cooling mode the direction of flow of the lubricant oil and cooling agent through the evaporator is opposite to the direction of flow of the cooling agent through the evaporator during the passive cooling mode.

In an embodiment of the first aspect, the second fluid by-pass line is connected to the first fluid line by a separating portion, and wherein the separating portion is adapted to physically separate lubricant oil from the compressed cooling agent during the active cooling mode, so that the lubricant oil is collected in the second fluid by-pass line.

By this separating portion, a significant portion of the lubricant oil present in the cooling agent flowing from the compressor through the first fluid line to the condensing unit, can be physically separated and thereby retained in the second fluid by-pass line, thereby reducing the amount of lubricant oil, which is circulated in the cooling circuit.

In an embodiment, the second fluid by-pass line is oriented vertically in the cooling device, wherein at the separating portion compressed gaseous cooling agent containing lubricant oil is adapted to enter the interior of the second fluid by-pass line through an end portion of the first fluid line, wherein said end portion penetrates a wall of said second fluid by-pass line, wherein the lubricant oil is adapted to be separated from the compressed gaseous cooling agent by the effect of gravity, the cooling device being configured so that the lubricant oil is adapted to drop down in the vertically oriented second fluid by-pass line, and the cooling device being configured so that the compressed gaseous cooling agent is adapted to rise up in the vertically oriented second fluid by-pass line by the pressure applied to the cooling agent from the compressor.

The mixture of lubricant oil and compressed cooling agent exits the end portion into the interior of the second fluid by-pass line with a high velocity, which results in a vortex and change of direction at the separating portion, which in turn results in that the compressed gaseous cooling agent is adapted to flow towards the condensing unit and the heavy lubricant oil particles move downwards within the second fluid by-pass line due to inertia and gravitational forces. Since the flow velocity of the compressed gaseous cooling agent towards the condensing unit is low, said cooling agent cannot push the heavy oil particles towards the condensing unit, so that an efficient oil separation is achieved. The lubricant oil collected in the second fluid by-pass line can subsequently by recycled back to the compressor by the third fluid line.

In an embodiment of the first aspect, the cooling circuit additionally comprises an expansion device, which is arranged in the second fluid line, wherein the expansion device is connected to the condensing unit by a first section of the second fluid line, and wherein the expansion device is connected to the evaporator by a second section of the second fluid line.

In an embodiment, the expansion device is positioned in the cooling circuit downstream of the condensing unit and upstream of the evaporator.

In an embodiment, the expansion device is adapted to expand the liquid cooling agent.

In an embodiment, the expansion device can be a thermal expansion valve, an electronic expansion valve, a capillary tube, an ejector, a turbine, a ball valve, an orifice and/or an porous plug.

In an embodiment of the first aspect, the first by-pass valve is formed as a three-way by-pass valve, which is arranged in the second fluid line, the first by-pass valve comprising a valve inlet, which is connected to the condensing unit by a first section of the second fluid line, a first valve outlet, which is connected to the bottom part of the evaporator by the first fluid by-pass line, and a second valve outlet, which is connected to the top part of the evaporator by a second section of the second fluid line, and a moveable valve body, which is adapted to close the first valve outlet in the active cooling mode, in order to connect the valve inlet with the second valve outlet, and which is adapted to close the second valve outlet in the passive cooling mode, in order to connect the valve inlet with the first valve outlet.

By adapting the first by-pass valve as a three-way by-pass valve, the function of the first by-pass valve could be expanded by allowing for an expansion of cooling agent flowing through the first and second section of the second fluid line before entering the top part of the evaporator, in particular by employing microchannels within the second valve outlet.

Moreover, due to the first by-pass valve being formed as a three-way by-pass valve, a single fluid connection, i.e. the first section of the second fluid line, between the inlet of the first by-pass valve and the condensing unit can be achieved.

In the active cooling mode, the moveable valve body in an embodiment is adapted to completely close the first valve outlet in order to avoid any leakage of cooling agent into the bottom part of the evaporator, which could reduce the efficiency of cooling. However, in the active cooling mode, the moveable valve body in particular is adapted to at least partially open the second valve outlet in order to regulate the flow of cooling agent through the second valve outlet.

In the passive cooling mode, the moveable valve body in an embodiment is adapted to completely open the first valve outlet in order to allow for an uninterrupted flow of cooling agent through the first valve outlet. However, in the passive cooling mode, the moveable valve body in an embodiment is adapted to at least partially close, i.e. fully or partially close, the second valve outlet, since it does not affect the performance of cooling.

In an embodiment a diameter of the second valve outlet is smaller than a diameter of the first valve outlet.

In an embodiment of the first aspect, the valve body is formed as a ball element, which is received in a ball housing of the first by-pass valve, wherein the ball element is rotatable between a first rotation position and a second rotation position, wherein the ball element comprises a channel for conducting cooling agent through the ball element in order to connect the valve inlet with the second valve outlet in the first rotation position and to connect the valve inlet with the first valve outlet in the second rotation position.

In an embodiment, the ball element is rotatable into intermediate rotational positions between the first and second rotation position, wherein in said intermediate rotational positions the channel for conducting cooling agent is partially sealed off by the ball housing, so that a partial flow of cooling agent and lubricant oil through the channel is maintained. In an embodiment, the ball is rotatable into variable intermediate rotational positions to at least partially open the second valve outlet, which results in variable flow rate of cooling agent through the second valve outlet.

In an embodiment, the first and second rotation position are oriented perpendicular with respect to each other.

In an embodiment the ball element comprises a rotation shaft, which penetrates the ball housing, wherein the rotation shaft is drivable by a motor of the ball valve in order to rotate the ball element between the first rotation position and the second rotation position.

In an embodiment of the first aspect, the second valve outlet comprises a plurality of microchannels, which are adapted to expand the liquid cooling agent conducted through them.

In an embodiment, the plurality of microchannels are adapted to expand the liquid cooling agent flowing therethrough, so that an expanded liquid cooling agent is obtained, wherein the expanded liquid cooling agent is adapted to flow through the second valve outlet to the evaporator, in particular to the top part of the evaporator, and wherein the evaporator is adapted to evaporate the expanded liquid cooling agent.

In an embodiment, the plurality of microchannels replace the function of an expansion device, which can be positioned in the second fluid line between the condensing unit and the evaporator. Consequently, when the plurality of microchannels are present in the second valve outlet, no expansion device is present in the second fluid line.

In an embodiment, the plurality of microchannels comprises straight microchannel with reduced diameters to allow for an efficient expansion of the liquid cooling agent flowing therethrough.

In an embodiment, the plurality of microchannels comprises a least one flat channel with interconnected channels with reduced diameter to allow for an efficient expansion of the liquid cooling agent flowing therethrough.

In an embodiment, the plurality of microchannels comprises a porous body comprising a plurality of pores, which form the microchannels with reduced diameter to allow for an efficient expansion of the liquid cooling agent flowing therethrough.

In an embodiment of the first aspect, the cooling device comprises a control, wherein the third fluid line comprises a sensor arrangement, which is adapted to detect a superheat of the cooling agent flowing through the third fluid line, and wherein the control is adapted to operate the first by-pass valve in dependence of the detected superheat of the cooling agent.

In an embodiment, the sensor arrangement comprises a pressure sensor, which is adapted to detect a pressure of the cooling agent flowing through the third fluid line and/or the sensor arrangement comprises a temperature sensor, which is adapted to detect a temperature of the cooling agent flowing through the third fluid line. In an embodiment, the sensor arrangement comprises both a pressure sensor and a temperature sensor.

In an embodiment, the control is adapted to switch the first by-pass valve in an at least partially closed state to reduce the flow rate of cooling agent, if the detected superheat is below a superheat threshold, wherein the superheat threshold in particular is defined by $\Delta T=T1-Ts$. $T1$ is the temperature of the cooling agent in the third fluid line as measured by the temperature sensor of the sensor arrangement. $Ts$ is the evaporation temperature of the cooling agent inside the evaporator, wherein the control is adapted to determine $Ts$ based on the pressure of the cooling agent in the evaporator, wherein said pressure is measured by the pressure sensor of the sensor arrangement.

In an embodiment, the control is adapted to switch the first by-pass valve in an at least partially opened state to increase the flow rate of cooling agent, if the detected superheat is above a superheat threshold, wherein the superheat threshold in particular is defined by $\Delta T=T1-Ts$. $T1$ and $Ts$ are determined as summarized above.

By this adaptive regulation of the flow rate of cooling agent through the evaporator the evaporation performance of the evaporator can be adjusted in a way that the superheat of the cooling agent is as close as possible to the superheat threshold, in order to allow for an in particular effective evaporation process and a reliable operation of the compressor is achieved by the resulting superheated gaseous cooling agent before entering to compressor.

In an embodiment of the first aspect, the cooling circuit comprises an additional evaporator, which comprises a top part, a bottom part, and a plurality of evaporating tubes connecting the top part with the bottom part, wherein the top part of the additional evaporator is connected to the bottom part of the evaporator by a first evaporator connecting line of the cooling circuit, and wherein the bottom part of the additional evaporator is connected to the compressor by the third fluid line, so that during the active cooling mode lubricant oil is adapted to be transferred from the bottom part of the evaporator through the first evaporator connecting line, through the top part of the additional evaporator, through the evaporating tubes of the additional evaporator, through the bottom part of the additional evaporator, and through the third fluid line back to the compressor.

The liquid cooling agent flowing through the evaporator is heated up within the plurality of evaporating tubes to the evaporation temperature. After that, only a part of the liquid phase of cooling agent is transformed into gaseous cooling agent, so that the vapor fraction of the mixture increases. But the vapor fraction of the mixture does not reach 100%, so the cooling agent flowing through the evaporator is not fully evaporated, but for example the cooling agent can form a two-phase mixture comprising both liquid cooling agent and gaseous cooling agent at the outlet of the evaporator.

When the not-fully evaporated cooling agent is adapted to subsequently flow through the additional evaporator the cooling agent is fully evaporated within the additional evaporator thereby due to warmer ambient air increasing the efficiency of the evaporation process.

In an embodiment of the first aspect, the cooling circuit comprises a second evaporator connecting line, which connects the top part of the additional evaporator with the second by-pass valve of the second fluid by-pass line.

In an embodiment of the first aspect, the second by-pass valve is formed as a three-way by-pass valve, which comprises a first valve inlet, which is connected to the top part of the evaporator by a first section of the second fluid by-pass line, a second valve inlet, which is connected to the top part of the additional evaporator by the second evaporator connecting line, and a valve outlet, which is connected to the condensing unit by a second section of the second fluid by-pass line, and a moveable valve body, which is adapted to close the first valve inlet, the second valve inlet and the valve outlet in the active cooling mode, and which is adapted to open the first valve inlet, the second valve inlet and the valve outlet in the passive cooling mode, in order to connect the first valve inlet and the second valve inlet with the first valve outlet.

Consequently, during the active cooling mode the first valve inlet, the second valve inlet and the valve outlet are completely closed to prevent any flow of cooling agent, while in the passive cooling mode the first valve inlet, the second valve inlet and the valve outlet are at least partially opened to ensure an effective flow of cooling agent.

In an embodiment by partially opening the first valve inlet, the second valve inlet and the valve outlet different flow resistance of the first and second valve inlet can be beneficial for balancing the flow rate between the evaporator and the additional evaporator during the passive cooling mode.

In an embodiment, this can be achieved by a different flow resistance for the first and second valve inlets, wherein such different flow resistance in particular can be achieved by means of different diameters of the first and second valve inlet and/or by a partial closing of one of the first or second valve inlets.

In an embodiment of the first aspect, the first by-pass valve of the cooling circuit is formed as a three-way by-pass valve, which comprises a valve inlet, which is connected to the condensing unit by a first section of the first fluid by-pass line, a first valve outlet, which is connected to the bottom part of the evaporator by a second section of the first fluid by-pass line and a second valve outlet, which is connected to the bottom part of the additional evaporator by a third evaporator connecting line.

In an embodiment a diameter of the second valve outlet is smaller than a diameter of the first valve outlet.

In an embodiment of the first aspect, the first by-pass valve of the cooling circuit is formed as a four-way by-pass valve, which comprises a valve inlet, which is connected to the condensing unit by a first section of the second fluid line, a first valve outlet, which is connected to the bottom part of the evaporator by the first fluid by-pass line, a second valve outlet, which is connected to the bottom part of the additional evaporator by a third evaporator connecting line, and a third valve outlet, which is connected to the top part of the evaporator by a second section of the second fluid line.

By adapting the first by-pass valve as a four-way by-pass valve, said four-way valve cannot only include the function of the first by-pass valve and an expansion device, but can also ensure separate fluid connections to the evaporator and to the additional evaporator, respectively.

In an embodiment a diameter of the third valve outlet is smaller than a diameter of the first and second valve outlet.

In an embodiment of the first aspect, the four-way by-pass valve comprises a moveable valve body, which is adapted to close the first valve outlet and the second valve outlet, while at the same time opening the valve inlet and third valve outlet, in the active cooling mode, and wherein the moveable valve body is adapted to close the third valve outlet, while at the same time opening the valve inlet, the first valve outlet and the second valve outlet in the passive cooling mode.

In an embodiment of the first aspect, the third valve outlet comprises a plurality of microchannels, which are adapted to expand the liquid cooling agent conducted through them.

In an embodiment, the plurality of microchannels comprises straight microchannel with reduced diameters to allow for an efficient expansion of the liquid cooling agent flowing therethrough.

In an embodiment, the plurality of microchannels comprises a least one flat channel with interconnected channels with reduced diameter to allow for an efficient expansion of the liquid cooling agent flowing therethrough.

In an embodiment, the plurality of microchannels comprises a porous body comprising a plurality of pores, which form the microchannels with reduced diameter to allow for an efficient expansion of the liquid cooling agent flowing therethrough.

In an embodiment of the first aspect, the valve body is formed as a ball element, which is received in a ball housing of the first by-pass valve, wherein the ball element is rotatable between a first rotation position and a second rotation position, wherein the ball element comprises a channel for conducting cooling agent through the ball element in order to connect the valve inlet with the third valve outlet in the first rotation position and to connect the valve inlet with the first and second valve outlet in the second rotation position.

In an embodiment of the first aspect, a diameter of the bottom part of the evaporator and/or additional evaporator is smaller than a diameter of the top part of the evaporator and/or additional evaporator.

In an embodiment of the first aspect, the bottom part of the evaporator and/or additional evaporator comprises a collecting portion, respectively, which is connected by the plurality of evaporating tubes of the evaporator and/or additional evaporator with the top part of the evaporator and/or additional evaporator, wherein the collecting portion comprises a separating element, which separates a lower part of the collecting portion from an upper part of the collecting portion, wherein the upper part is connected to the plurality of evaporating tubes, wherein between the separating element and a wall of the collecting portion at least one opening is formed for conducting cooling agent from the lower part to the upper part of the collecting portion during a passive cooling mode.

The at least one opening in an embodiment comprises at least one gap, in particular two opposing gaps, between the separating element and the wall of the collecting portion.

Through the at least opening an in particular effective flow of cooling agent during the passive cooling mode is ensured.

In an embodiment, the plurality of evaporating tubes comprise a plurality of parallel evaporating tubes.

In an embodiment, the separating element is formed as a separating plate or separating tube.

In an embodiment of the first aspect, in the active cooling mode cooling agent is adapted to flow from the top part of the evaporator and/or additional evaporator through the plurality of evaporating tubes, to the upper part of the collecting portion, and wherein in the passive cooling mode cooling agent is adapted to flow from the lower part of the collecting portion, through the at least one opening, through the upper part of the collecting portion and through the plurality of evaporating tubes into the top part of the evaporator and/or additional evaporator.

In an embodiment of the first aspect, the separating element comprises a recess, which is adapted to convey lubricant oil in the active cooling mode from the recess into an oil receiving portion of the collecting portion.

The recess allows for an effective uptake of lubricant oil.

In an embodiment, the separating element and/or recess is arranged inclined within the collecting portion so that the lubricant oil is conveyed into the oil receiving portion by gravity.

In an embodiment, the pressure of the cooling agent conducted through the evaporator and/or additional evaporator is adapted to exert pressure on the lubricant oil in the recess, in order to convey the lubricant oil into the oil receiving portion.

In an embodiment of the first aspect, the collecting portion comprises an outlet tube, which is connected to the third fluid line or to the first evaporator connecting line, wherein the outlet tube extends partially into the oil receiving portion, so that gaseous cooling agent exciting the outlet tube during the active cooling mode is adapted to flow through the lubricant oil received in the oil receiving portion, and thereby moving the lubricant oil from the oil receiving portion to the third fluid line.

According to a second aspect a method for cooling by using a cooling circuit of a cooling device is provided, wherein the cooling circuit comprises a compressor, a condensing unit, which is connected to the compressor by a first fluid line of the cooling circuit, an evaporator, which comprises a top part, a bottom part, and a plurality of evaporating tubes connecting the top part with the bottom part, wherein the top part is connected to the condensing unit by a second fluid by-pass line of the cooling circuit, and wherein the bottom part is connected to the compressor by a third fluid line, and a first fluid by-pass line of the cooling circuit, which connects the condensing unit with the bottom part of the evaporator, wherein the first fluid by-pass line comprises a first by-pass valve, and wherein the second fluid by-pass line comprises a second by-pass valve, the method comprising the following operations: closing of the first fluid by-pass line in an active cooling mode by the first by-pass valve, closing of the second fluid by-pass line in the active cooling mode by the second by-pass valve, compressing cooling agent present in the cooling circuit during the active cooling mode by the compressor, wherein the compressed cooling agent contains lubricant oil from the compressor, and transferring lubricant oil from the compressor through the condensing unit, through the evaporator and through the third fluid line back to the compressor in the active cooling mode.

In an embodiment of the second aspect, the method comprises the following operations: opening of the first fluid by-pass line in a passive cooling mode by the first by-pass valve, and opening of the second fluid by-pass line in the passive cooling mode by the second by-pass valve, so that the cooling agent is adapted to directly flow from the condensing unit through the first fluid by-pass line to the evaporator, and through the second fluid by-pass line back to the condensing unit.

In an embodiment of the second aspect, in an active cooling mode, lubricant oil is transferred from the condensing unit back to the compressor by the second fluid by-pass line.

Details of one or more examples are set forth in the accompanying drawings and the description below. Other features, objects, and advantages will be apparent from the description, drawings, and claims.

BRIEF DESCRIPTION OF THE DRAWINGS

In the following, examples of the disclosure are described in more detail with reference to the attached figures and drawings, in which.

In the following, identical reference signs refer to identical or at least functionally equivalent features.

DETAILED DESCRIPTION OF THE EXAMPLES

In the following description, reference is made to the accompanying figures, which form part of the disclosure, and which show, by way of illustration, aspects of examples of the disclosure or aspects in which examples of the disclosure may be used. It is understood that examples of the disclosure may be used in other aspects and comprise structural or logical changes not depicted in the figures. The following detailed description, therefore, is not to be taken in a limiting sense, and the scope of the disclosure is defined by the appended claims.

For instance, it is to be understood that a disclosure in connection with a described method may also hold true for a corresponding device or system configured to perform the method and vice versa. For example, if one or a plurality of method operations are described, a corresponding device may include one or a plurality of units, e.g. functional units, to perform the described one or plurality of method operations (e.g. one unit performing the one or plurality of operations, or a plurality of units each performing one or more of the plurality of operations), even if such one or more units are not explicitly described or illustrated in the figures. On the other hand, for example, if an apparatus is described based on one or a plurality of units, e.g. functional units, a corresponding method may include one operation to perform the functionality of the one or plurality of units (e.g. one operation performing the functionality of the one or plurality of units, or a plurality of operations each performing the functionality of one or more of the plurality of units), even if such one or plurality of operations are not explicitly described or illustrated in the figures. Further, it is understood that the features of the various examples and/or aspects described herein may be combined with each other, unless specifically noted otherwise.

Figure 1:
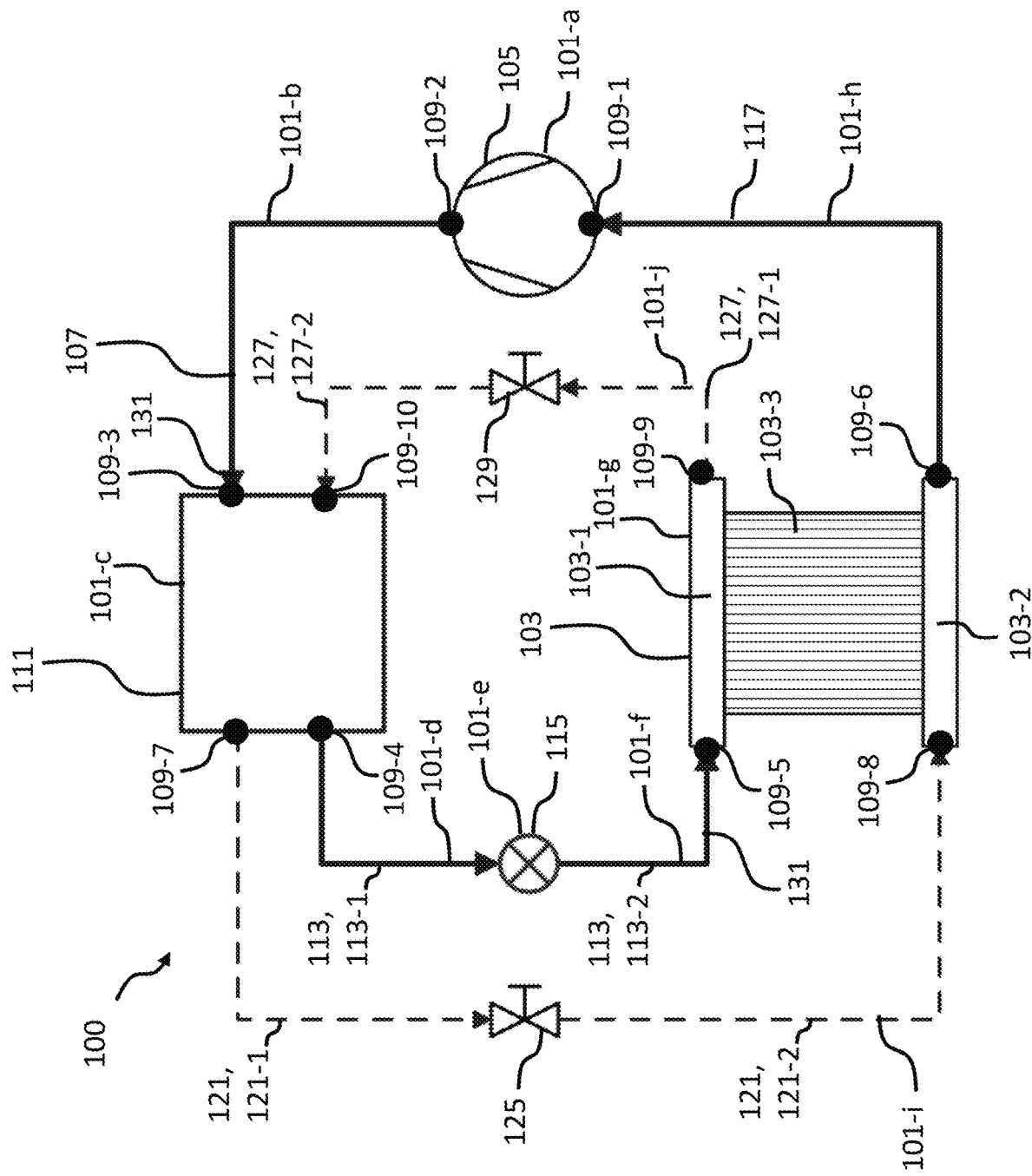
FIG. 1 is a schematic diagram of a cooling device comprising a cooling circuit during an active cooling mode according to an embodiment of the application.

FIG. 1 is a schematic diagram of a cooling device 100 comprising a cooling circuit 101 during an active cooling mode according to an example. The cooling device 100, which is only schematically shown in FIG. 1, is not limited to any specific cooling application, but is adapted to cool any media, for example ambient air, liquid from an additional cooling circuit of another cooling device, a solid element, which generates heat, or any other solid or liquid material. Therefore, heating, ventilation, and air conditioning devices (HVAC) are comprised by a cooling device 100 according to the example.

Only as an example, the cooling device 100 according to the example is adapted to cool a cabinet, for example a server cabinet, which for example directly cools servers within said exemplary server cabinet or which for example cools the air within said exemplary server cabinet, thereby indirectly cooling the servers.

As illustrated in FIG. 1, the cooling circuit 101 of the cooling device 100 comprises inter alia a compressor 105, a condensing unit 111, an expansion device 115, and an evaporator 103, which are fluidically connected within the cooling circuit 101. A cooling agent, for example tetrafluorethane, is flowing through the cooling circuit 101. Said cooling agent is characterized in that it can be present in the cooling circuit 101 in two phases, e.g. in a liquid and in a gaseous phase. At lower temperatures and/or higher pressure the cooling agent is typically present in the liquid phase, while at higher temperatures and/or lower pressure, the cooling agent is typically present in the gaseous phase.

In the following the cooling circuit 101 of the cooling device 100 is described, wherein in particular reference to an active cooling mode is provided.

The compressor 105 forms a first section 101-a of the cooling circuit 101. The compressor 105 is positioned in the cooling circuit 101 downstream of the evaporator 103. The compressor is adapted to compress the gaseous cooling agent during the active cooling mode, in order to obtain compressed gaseous cooling agent. During compression, the compressor 105, which is driven by electrical and/or mechanical energy, pressurizes the gaseous cooling agent thereby allowing for an increase of temperature of the cooling agent and for an active flow of the compressed gaseous cooling agent further downstream through the cooling circuit 101.

In this respect, it is mentioned that the compressor 105 is formed as an oil-lubricated compressor 105, which is characterized in that its moving parts are lubricated by lubricant oil to reduce friction. However, during compression, at least a part of the lubricant oil, which is present in the compressor 105, can be transported together with the compressed gaseous cooling agent further downstream in the cooling circuit 101.

At a first connection point 109-1, the compressor 105 is connected to a third fluid line 117 of the cooling circuit 101. At a second connection point 109-2, the compressor 105 is connected to a first fluid line 107 of the cooling circuit 101, wherein the first fluid line 107 forms a second section 101-b of the cooling circuit 101. The first fluid line 107 is adapted to transfer the compressed gaseous cooling agent from the compressor 105 to the condensing unit 111, wherein the condensing unit 111 forms a third section 101-c of the cooling circuit 101. The first fluid line 107 is connected to the condensing unit 111 at a third connection point 109-3.

The condensing unit 111, which is positioned in the cooling circuit 101 downstream of the compressor 105, is adapted to condensate the compressed cooling agent by dissipating heat from the cooling agent, in order to obtain liquid cooling agent.

Said heat dissipating from the condensing unit 111 typically is adapted to be transferred to a flow of ambient air, which temperature is lower than the temperature of the cooling agent entering the condensing unit 111, to allow for a heat transfer from the cooling agent flowing through the condensing unit 111 to the ambient air. To enable an efficient heat dissipation, the condensing unit 111 in particular comprises extended surface areas, which for example can comprise at least one condensing tube, a top part of the condensing unit 111, a bottom part of the condensing unit 111, and/or condensing fins.

At a fourth connection point 109-4, the condensing unit 111 is connected to a first section 113-1 of a second fluid line 113 of the cooling circuit 101, wherein said first section 113-1 of the second fluid line 113 forms a fourth section 101-d of the cooling circuit 101. The first section 113-1 of the second fluid line 113 is adapted to transfer the liquid cooling agent from the condensing unit 111 to the expansion device 115, which forms a fifth section 101-e of the cooling circuit 101.

The expansion device 115 in particular is positioned in the cooling circuit 101 downstream of the condensing unit 111 and upstream of the evaporator 103. The expansion device 115 in particular is adapted to expand the liquid cooling agent, in order to obtain expanded liquid cooling agent, wherein said expanded liquid cooling agent in particular can comprise a two-phase mixture of gaseous and liquid cooling agent. The expansion device 115 in particular can be a thermal expansion valve, an electronic expansion valve, a capillary tube, an ejector, a turbine, a ball valve, an orifice and/or a porous plug.

A second section 113-2 of the second fluid line 119 of the cooling circuit 101, which forms a sixth section 101-f of the cooling circuit 101, connects the expansion device 115 with the evaporator 103, in particular at a fifth connection point 109-5. The evaporator 103 forms a seventh section 101-g of the cooling circuit 101.

At a sixth connection point 109-6, the evaporator 103 is connected to the third fluid line 117 of the cooling circuit 101, wherein said third fluid line 117 forms an eighth section 101-h of the cooling circuit 101. The third fluid line 117 is adapted to transfer the gaseous cooling agent from the evaporator 103 to the compressor 105 thereby closing the cooling circuit 101.

The evaporator 103 is adapted to evaporate the cooling agent present in the liquid state in the cooling circuit 101 by supplying heat to the cooling agent, in order to obtain a gaseous cooling agent.

As can be derived from FIG. 1, the evaporator 103 comprises a top part 103-1, which is connected to the expansion device 115 by the second section 113-2 of the second fluid line 113. The evaporator 103 further comprises a bottom part 103-2, which is connected to the compressor 105 by the third fluid line 117. The evaporator 103 further comprises a plurality of evaporating tubes 103-3, which connect the top part 103-1 with the bottom part 103-2 of the evaporator 103.

Said heat supply to the evaporator 103 typically is provided by a flow of ambient air, which temperature is higher than the temperature of the cooling agent entering the evaporator 103, to allow for a heat transfer from the ambient air to the cooling agent flowing through the evaporator 103. To enable an efficient heat transfer, the evaporator 103 in particular comprises extended surface areas, which can comprise the plurality of evaporating tubes 103-3, the top part 103-1 of the evaporator 103, the bottom part 103-1 of the evaporator 103, and/or optional evaporating fins.

At a seventh connection point 109-7, the condensing unit 111 is connected to a first fluid by-pass line 121 of the cooling circuit 101, which forms ninth section 101-i of the cooling circuit 101, wherein the first fluid by-pass line 121 comprises a first by-pass valve 125, which is adapted to close the first fluid by-pass line 121 in the active cooling mode. The first fluid by-pass line 121 is connected to the bottom part 103-2 of the evaporator 103 at an eighth connection point 109-8, wherein said first fluid by-pass line 121 will be explained in more detail further below.

At a ninth connection point 109-9, the evaporator 103 is connected to a second fluid by-pass line 127 of the cooling circuit 101, which forms a tenth section 101-j of the cooling circuit 101, wherein the second fluid by-pass line 127 comprises a second by-pass valve 129, which is adapted to close the second fluid by-pass line 127 in the active cooling mode. The second fluid by-pass line 127 joins the condensing unit 111 at a tenth connection point 109-10. The second fluid by-pass line 127 will be explained in more detail further below.

The above described active cooling mode of the cooling is typically required when the temperature of ambient air, which in particular corresponds to air contacting the condensing unit, is above or close to the temperature of air inside the cabinet, which in particular corresponds to air flowing from the evaporator to the cabinet. Said active cooling mode requires the active work of the compressor 105 and thereby consumes electrical energy.

During the active cooling mode the compressor 105 of the cooling circuit 101 is activated, the first by-pass valve 125 is adapted to close the fluid by-pass line 121, and the second by-pass valve 129 is adapted to at least partially close the second fluid by-pass line 127.

Therefore, during the active cooling mode the cooling agent is adapted to be transferred from the compressor 105, through the first fluid line 107, through the condensing unit 111, through the first section 113-1 of the second fluid line 113, through the expansion device 115, through the second section 113-3 of the second fluid line 113, through the top part 103-1 of the evaporator 103, through the plurality of evaporating tubes 103-3 of the evaporator 103, through the bottom part 103-2 of the evaporator, and through the third fluid line 117 back to the compressor 105.

The circulation between vapor and liquid phases of the cooling agent within the cooling circuit 101 during the active cooling mode is enabled by active work from the compressor 105, in combination with the expansion of liquid cooling agent at the expansion device 115.

The corresponding direction of flow of the cooling agent 131 in the active cooling is marked with solid arrows in FIG. 1. The direction of flow of the cooling agent in the passive cooling is marked with dashed arrows in FIG. 1.

As mentioned above, due to employing an oil-lubricated compressor 105, oil particles can be transferred together with the compressed gaseous cooling agent from the compressor 105 to other components of the cooling circuit 101, which are located downstream of the compressor 105, for example to the condensing unit 111, the expansion device 115 and/or the evaporator 103.

Deposits of lubricant oil within for example the evaporator 103 and/or condensing unit 111 might impair the efficiency of heat transfer with the ambient air, and deposits of lubricant oil within for example the expansion device 115 might restrict the flow of cooling agent through the expansion device 115. Moreover, the presence of dissolved lubricant oil in the liquid phase of the cooling agent, leads to an increase in the viscosity of the cooling agent and to a significant increase of the flow resistance. At such condition, the force of gravity is not enough for an efficient circulation and the thermal performance of the cooling device 100 during the passive cooling mode is poor.

The example of the disclosure allows for an efficient prevention of deposits of lubricant oil within the condensing unit 111, the expansion device 115 and/or evaporator 103 as summarized in the following.

The compressed gaseous cooling agent together with liquid lubricant oil forms a two-phase mixture, which is adapted to flow from the compressor 105 through the first fluid line 107 into the condensing unit 111. At the condensing unit 111 during condensation the gaseous cooling agent is transformed into liquid cooling agent, wherein the liquid lubricant oil is adapted to be dissolved in the obtained liquid cooling agent, thereby forming a one-phase mixture.

The one-phase mixture comprising liquid cooling agent and the liquid lubricant oil dissolved therein is adapted to be conducted through the second fluid line 113 and is expanded in the expansion device 115 before said one-phase mixture is adapted to enter the top part 103-1 of the evaporator 103.

When the one-phase mixture subsequently is adapted to flow from the top part 103-1 of the evaporator 103 through the plurality of evaporating tubes 103-3 the liquid cooling agent is evaporated by the supply of external heat, so that a gaseous cooling agent and the liquid lubricant oil is formed as a two-phase mixture again.

Since the direction of flow of the two-phase mixture is aligned to the force of gravity acting on the liquid lubricant oil particles, the movement of said liquid oil particles from the plurality of evaporating tubes 103-3 to the bottom part 103-2 of the evaporator 103 is efficiently supported, thereby preventing any deposits of lubricant oil within the evaporating tubes 103-3.

Any lubricant oil obtained in the bottom part 103-2 of the evaporator 103 is adapted to be transferred further in the third fluid line 117 by the pressure, which is exerted by the gaseous cooling agent on the lubricant oil particles, thereby pushing the lubricant oil particles into the third fluid line 117 and further to the compressor 105.

Therefore, due to the design of the evaporator 103 any lubricant oil exiting the compressor 105 together with the cooling agent during the active cooling mode is recycled back to the compressor 105. Therefore, a stable return of lubricant oil from the evaporator 103 the compressor 105 is ensured.

In case, the temperature of ambient air, which in particular corresponds to air contacting the condensing unit, is below the temperature of air inside the cabinet, which in particular corresponds to air flowing from the evaporator to the cabinet, a passive cooling mode can be applied. In the passive cooling mode, the compressor 105 is adapted to be deactivated for energy saving, and the circulation of the cooling agent through the cooling circuit 101 is provided by the principle of a loop thermosiphon (LTS). The function of the passive cooling mode is described in respect to the example of FIG. 2.

Figure 2:
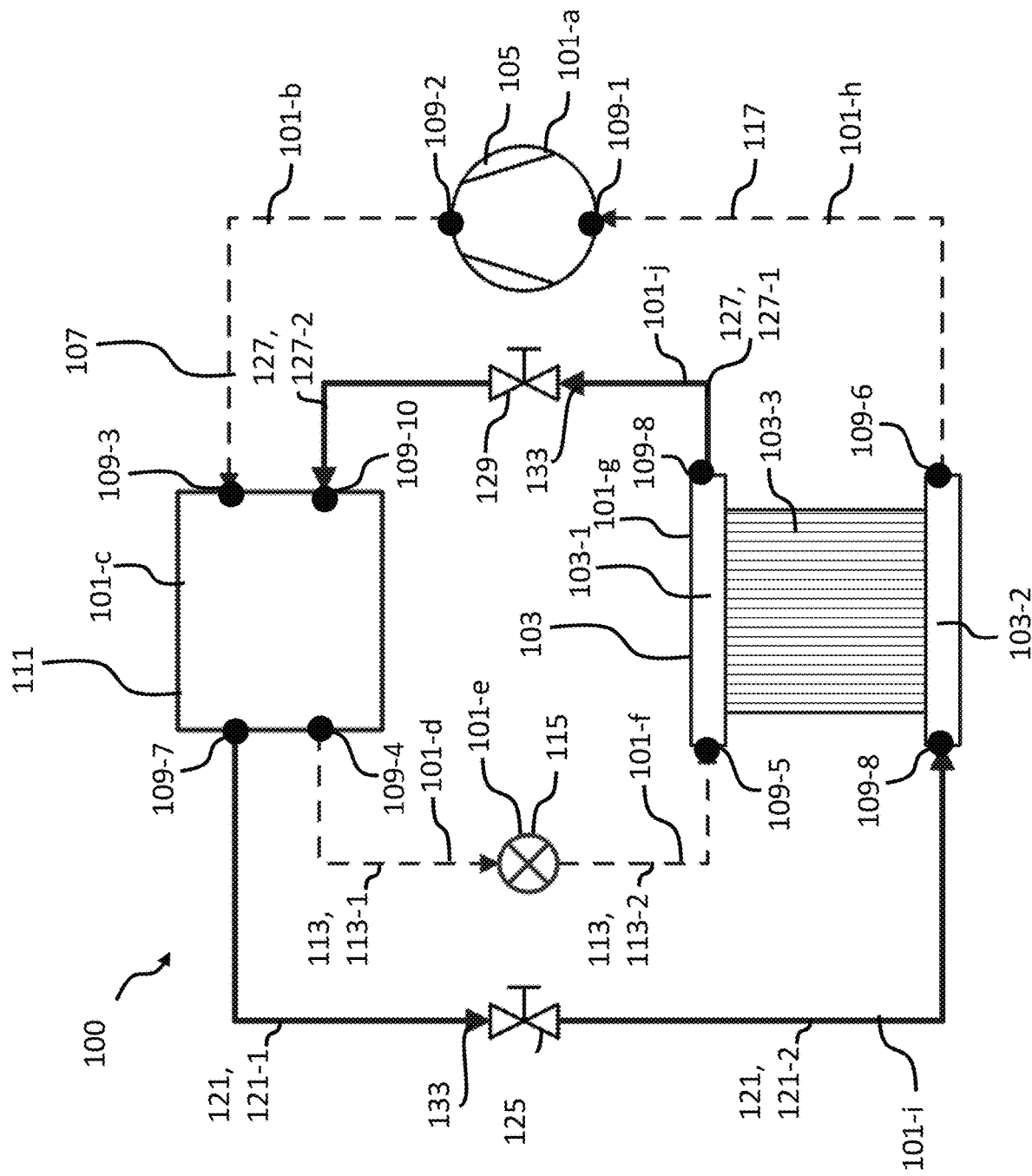
FIG. 2 is a schematic diagram of a cooling device comprising a cooling circuit during a passive cooling mode according to an embodiment of the application.

FIG. 2 is a schematic diagram of a cooling device 100 comprising a cooling circuit 101 during a passive cooling mode according to an example.

The cooling circuit 101 depicted in FIG. 2 is identical to the cooling circuit 101 depicted in FIG. 1 except for the passive cooling mode applied.

During the passive cooling the first by-pass valve 125 is adapted to open the first fluid by-pass line 121, so that during the passive cooling mode the liquid cooling agent is adapted to flow from the condensing unit 111 through the first fluid by-pass line 121, through the bottom part 103-2 of the evaporator 103 into the plurality of evaporating tubes 103-3 of the evaporator 103, in which the liquid cooling agent is evaporated thereby obtaining gaseous cooling agent.

Due to the force of gravity the gaseous cooling agent is separated from the liquid cooling agent within the evaporating tubes 103-3 resulting in that the gaseous cooling agent rises up within the plurality of evaporating tubes 103-3, and the gaseous cooling agent is adapted to subsequently flow from the top part 103-1 of the evaporator 103 into the second fluid by-pass line 127.

During the passive cooling mode the compressor 105 of the cooling circuit 101 is adapted to be deactivated and the second by-pass valve 129 is adapted to open the second fluid by-pass line 127, so that during the passive cooling mode the gaseous cooling agent, which has been evaporated in the evaporator 103, is adapted to flow from the top part 103-1 of the evaporator 103 through the second fluid by-pass line 127 to the condensing unit 111. In the condensing unit 111 the gaseous cooling agent is liquified, in order to obtain liquid cooling agent again, thereby closing the passive cooling cycle.

The corresponding direction of flow of the cooling agent 133 in the passive cooling mode is marked with solid arrows in FIG. 2. The direction of flow of the cooling agent in the active cooling is marked with dashed arrows in FIG. 2.

The circulation between vapor and liquid phases of the cooling agent between the condensing unit 111 and the evaporator 103 during the passive cooling mode in particular is enabled by the natural flow of the cooling agent due to gravitational forces.

Further, during the passive cooling mode, oil migration of lubricant oil through the cooling circuit 101 is not significant, because the compressor 105 is adapted to be deactivated and the main volume of lubricant oil is maintained at the compressor 105.

Figure 3:
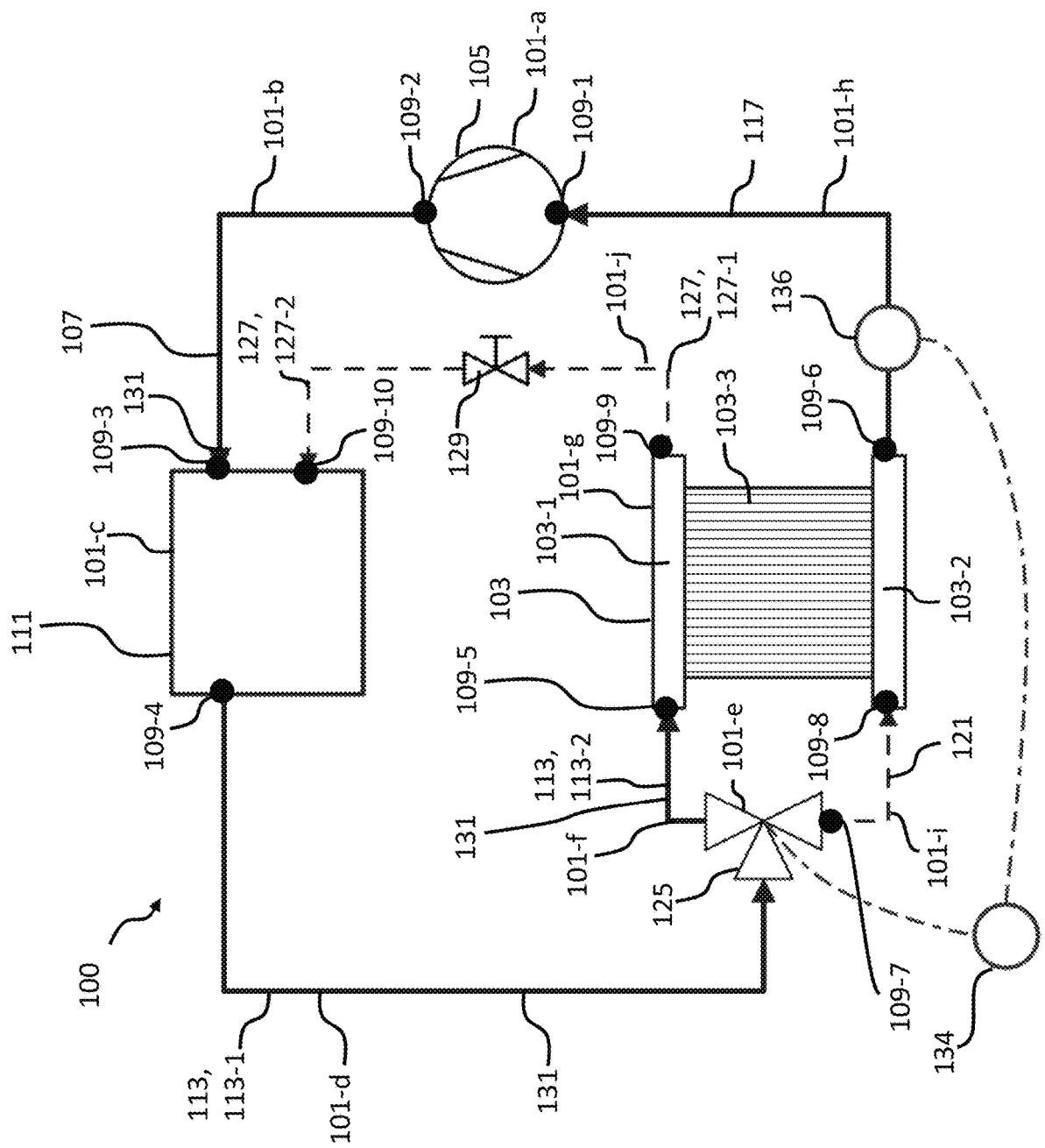
FIG. 3 is a schematic diagram of a cooling device comprising a cooling circuit during an active cooling mode according to an embodiment of the application.

FIG. 3 is a schematic diagram of a cooling device 100 comprising a cooling circuit 101 during an active cooling mode according to an example.

The example depicted in FIG. 3 is similar to the example depicted in FIG. 1 except for the difference that the functions of the first by-pass valve 125 and the expansion device 115 shown in the example of FIG. 1 have been included in a single three-way by-pass valve 125 according to the example of FIG. 3.

The first by-pass valve 125, which is formed as a three-way valve, is arranged in the second fluid line 113, and is connected to the condensing unit 111 by the first section 113-3 of the second fluid line 113, and is connected to the top part 103-1 of the evaporator 103 by the second section 113-2 of the second fluid line 113, and is connected to the bottom part 103-2 of the evaporator 103 by the first fluid by-pass line 121.

Since the fluid connection between the first by-pass valve 125, which is formed as a three-way valve, and the second section 113-2 of the second fluid line 113 allows for a significant pressure drop, the liquid cooling agent flowing from the first by-pass valve 125 to the second section 113-2 of the second fluid line 113 is expanded similar to the function of an expansion device 115 shown in the example according to FIG. 1.

By including the function of the expansion device 115 into the first by-pass valve 125, the overall design of the cooling circuit 101 can be simplified.

As can be derived from FIG. 3, the cooling device 100 comprises a control 134, wherein the third fluid line 117 comprises a sensor arrangement 136, which is adapted to detect a superheat of the cooling agent flowing through the third fluid line 117. The control 134 is adapted to operate the first by-pass valve 125 in dependence of the detected superheat of the cooling agent during the active cooling mode as summarized in the following.

In an embodiment, the sensor arrangement 136 comprises a pressure sensor, which is adapted to detect a pressure of the cooling agent flowing through the third fluid line 117 and/or the sensor arrangement 136 comprises a temperature sensor, which is adapted to detect a temperature of the cooling agent flowing through the third fluid line 117. In an embodiment, the sensor arrangement 136 comprises both a pressure sensor and a temperature sensor.

In an embodiment, the control 134 is adapted to switch the first by-pass valve 125 in an at least partially closed state to reduce the flow rate of cooling agent, if the detected superheat is below a superheat threshold, wherein the superheat threshold in particular is defined by $\Delta T = T1 - Ts$. $T1$ is the temperature of the cooling agent in the third fluid line 117 as measured by the temperature sensor of the sensor arrangement 136. $Ts$ is the evaporation temperature of the cooling agent inside the evaporator 103, wherein the control is adapted to determine Ts based on the pressure of the cooling agent in the evaporator, wherein said pressure is measured by the pressure sensor of the sensor arrangement.

In an embodiment, the control 134 is adapted to switch the first by-pass valve 125 in an at least partially opened state to increase the flow rate of cooling agent, if the detected superheat is above the superheat threshold, wherein the superheat threshold in particular is defined by $\Delta T=T1-Ts$. T1 and Ts are determined as summarized above.

By this adaptive regulation of the flow rate of cooling agent flowing through the evaporator 103 the evaporation performance of the evaporator 103 can be adjusted in a way that the superheat of the cooling agent is as close as possible to the superheat threshold, in order to allow for an in particular effective evaporation process and a reliable operation of the compressor.

In an embodiment, to allow for a partially closed state or partially opened state of the first by-pass valve 125, the first by-pass valve 125 in particular is formed as ball valve, comprising a ball element, which is rotatably received in a ball housing, as shown in the examples according to FIGS. 5A, 5B, 6A, 6B, 7A, 7B and 7C. In an embodiment, a partially closed state or a partially opened state of the first by-pass valve 125 is shown in the examples according to FIGS. 7A, 7B and 7C.

Figure 4:
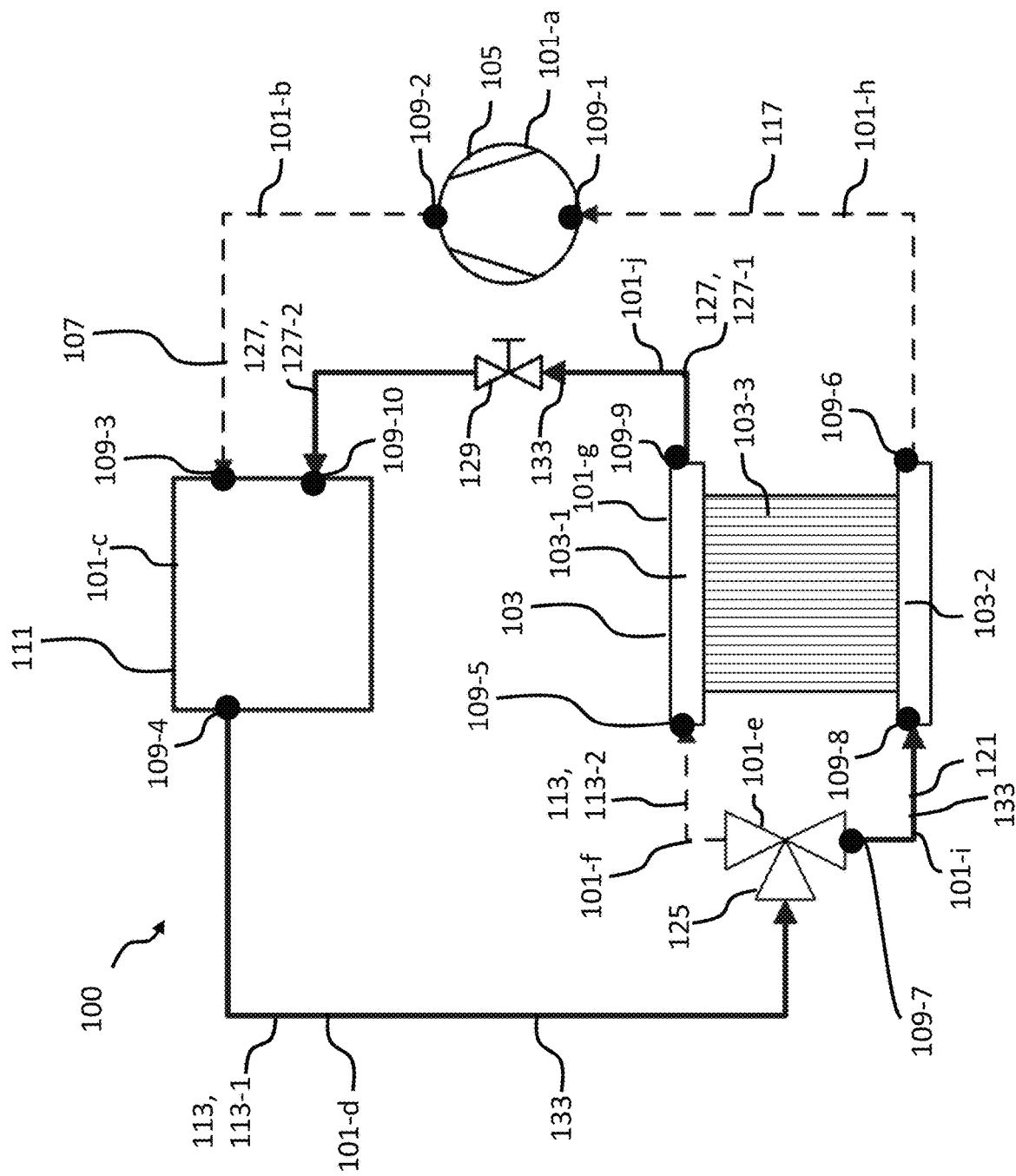
FIG. 4 is a schematic diagram of a cooling device comprising a cooling circuit during a passive cooling mode according to an embodiment of the application.

FIG. 4 is a schematic diagram of a cooling device 100 comprising a cooling circuit 101 during a passive cooling mode according to an example.

The cooling circuit 101 depicted in FIG. 4 is identical to the cooling circuit 101 depicted in FIG. 3 except for the passive cooling mode applied.

According to the passive cooling mode shown in FIG. 4, the liquid cooling agent obtained from the condensing unit 111 is adapted to be transferred through the first section 113-1 of the second fluid line 113, through the first by-pass valve 115, through the first fluid by-pass line 121 and through the bottom part 103-2 of the evaporator 103 into the plurality of evaporating tubes 103-2, in which the liquid cooling agent is evaporated to obtain gaseous cooling agent.

The gaseous cooling agent subsequently is adapted to be transferred from the plurality of evaporating tubes 103-2, through the top part 103-1 of the evaporator 103 and through the second fluid by-pass line 127 to the condensing unit 111 thereby closing the passive cooling cycle.

Since the fluid connection between the first by-pass valve 125, which is formed as a three way valve, and the first fluid by-pass line 121 only results in a minimal pressure drop, the liquid cooling agent flowing from the first by-pass valve 125 to the first fluid by-pass line 121 is not hindered, so an effective circulation of the cooling agent during the passive cooling mode is ensured.

Figure 5:
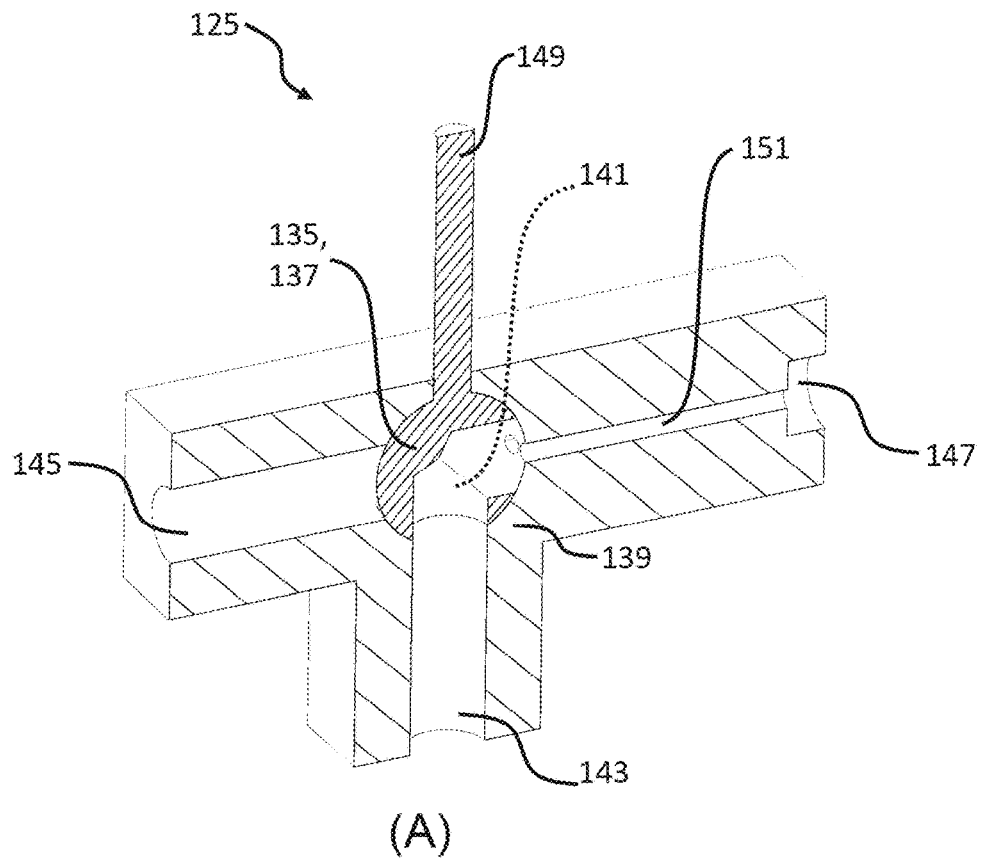
FIGS. 5A and 5B are schematic diagrams of a three-way by-pass valve of a cooling circuit according to an embodiment of the application.
Figure 5:
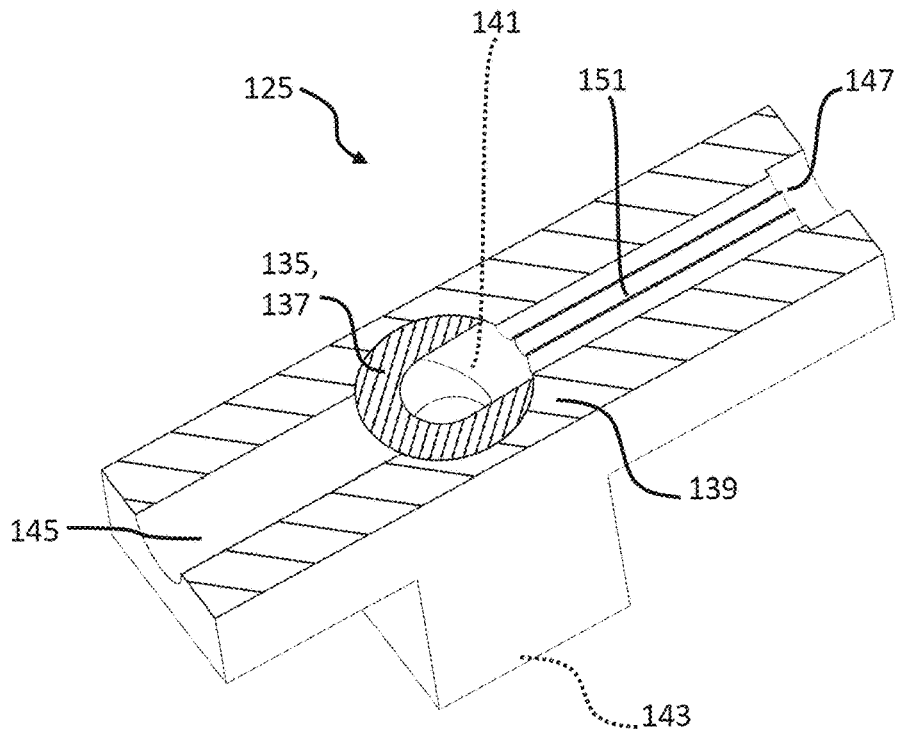

FIGS. 5A and 5B are schematic diagrams of a three-way by-pass valve of a cooling circuit according to an example.

In an embodiment, the three-way by-pass valve shown in FIGS. 5A and 5B corresponds to the first by-pass valve 125 shown in FIGS. 3 and 4.

The first by-pass valve 125, which is formed as a three-way by-pass valve 125, comprises a valve inlet 143, which is connected to the condensing unit 111 by a first section 113-1 of the second fluid line 113. The first by-pass valve 125 comprises a first valve outlet 145, which is connected to the bottom part 103-2 of the evaporator 103 by the first fluid by-pass line 121. The first by-pass valve 125 comprises a second valve outlet 147, which is connected to the top part 103-1 of the evaporator 103 by a second section 113-2 of the second fluid line 113.

The first by-pass valve 125 shown in FIGS. 5A and 5B is formed as a ball valve comprising a movable valve body 135, in particular a ball element 137, which is received in a ball housing 139.

The ball element 137 is rotatable between a first rotation position and a second rotation position, wherein in both FIGS. 5A and 5B only the first rotation position is depicted. In an embodiment, the first rotation position corresponds to the operation of the cooling device 100 during the active cooling mode.

In an embodiment, the first and second rotation position are perpendicular with respect to each other.

In an embodiment, the ball element 137 comprises a rotation shaft 149, which penetrates the ball housing 139, wherein the rotation shaft 149 is drivable by a motor of the ball valve in order to rotate the ball element 137 between the first rotation position and the second rotation position.

The ball element 137 comprises a channel 141 for conducting cooling agent through the ball element 137.

In the first rotation position shown in FIGS. 5A and 5B the channel 141 connects the valve inlet 143 with the second valve outlet 147, so that liquid cooling agent is adapted to enter the first by-pass valve 125 through the valve inlet 143 and is adapted to exit the first by-pass valve 125 through the second valve outlet 147.

In the first rotation position shown in FIGS. 5A and 5B the first valve outlet 145 is sealed off by the ball element 137 thereby preventing any flow of cooling agent through the first valve outlet 145.

As can be seen in FIGS. 5A and 5B, the second valve outlet 147 comprises a plurality of microchannels 151, which are adapted to expand the liquid cooling agent conducted through them in order to ensure the expansion function of the first by-pass valve 125 formed as three-way valve.

In an embodiment, the rotation of the ball element 137 between the first rotation position and the second rotation position also comprises intermediate positions of the ball element 137, so that the flow rate of cooling agent flowing through the channel 141 can be controlled by partially opening e.g. by partially closing the second valve outlet 147.

In an embodiment, the diameter of the first valve outlet 145 is greater than the diameter of the second valve outlet 147 to allow for an efficient low-resistance flow of cooling agent through the second valve outlet 147 during the passive cooling mode.

Figure 6:
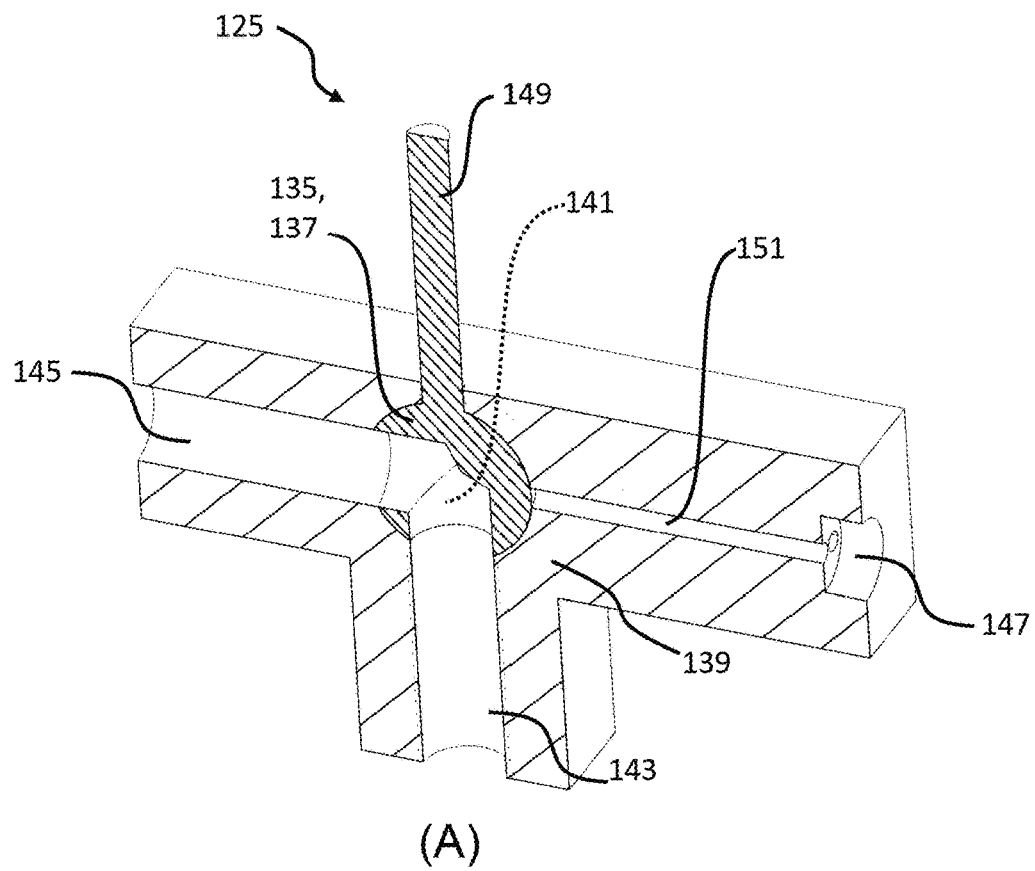
FIGS. 6A and 6B are schematic diagrams of a three-way by-pass valve of a cooling circuit according to an embodiment of the application.
Figure 6:
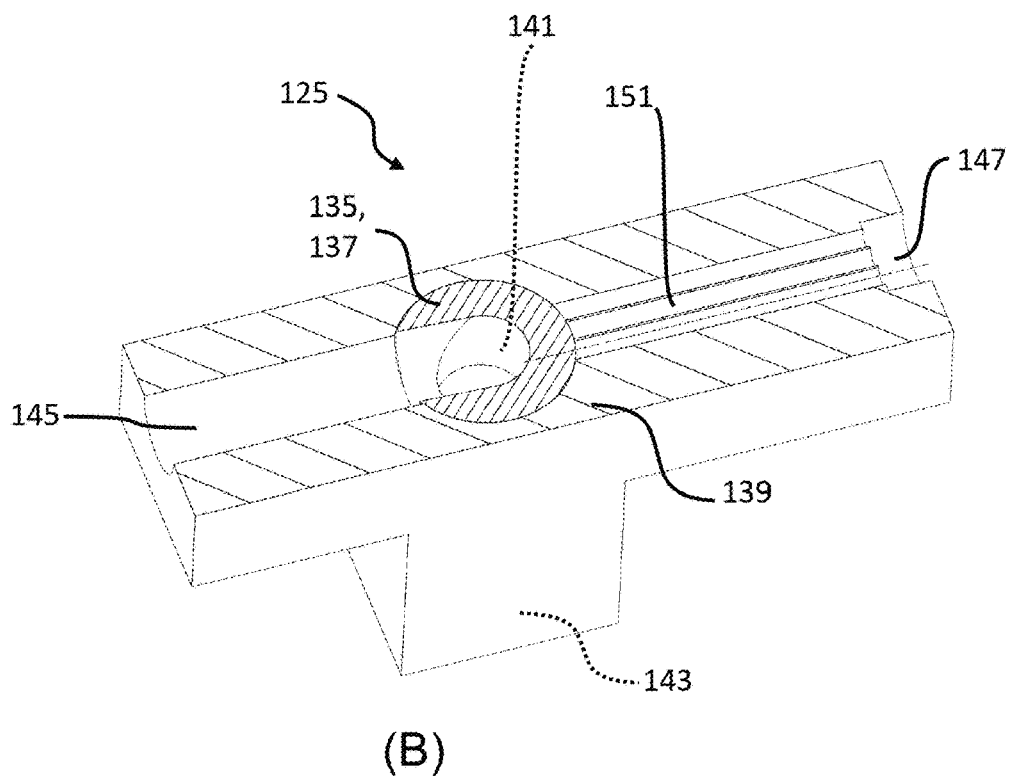

FIGS. 6A and 6B are schematic diagrams of a three-way by-pass valve of a cooling circuit according to an example.

The first by-pass valve 125 shown in FIGS. 6A and 6B corresponds to the first by-pass valve 125 shown in FIGS. 5A and 5B except that in FIGS. 6A and 6B the second rotation position of the ball element 137 during the passive cooling mode is shown.

In the second rotation position shown in FIGS. 6A and 6B the channel 141 connects the valve inlet 143 with the first valve outlet 145, so that liquid cooling agent is adapted to enter the first by-pass valve 125 through the valve inlet 143 and is adapted to exit the first by-pass valve 125 through the first valve outlet 145.

In the second rotation position shown in FIGS. 6A and 6B the second valve outlet 147 is sealed off by the ball element 137 thereby preventing any flow of cooling agent through the first valve outlet 145.

Figure 7:
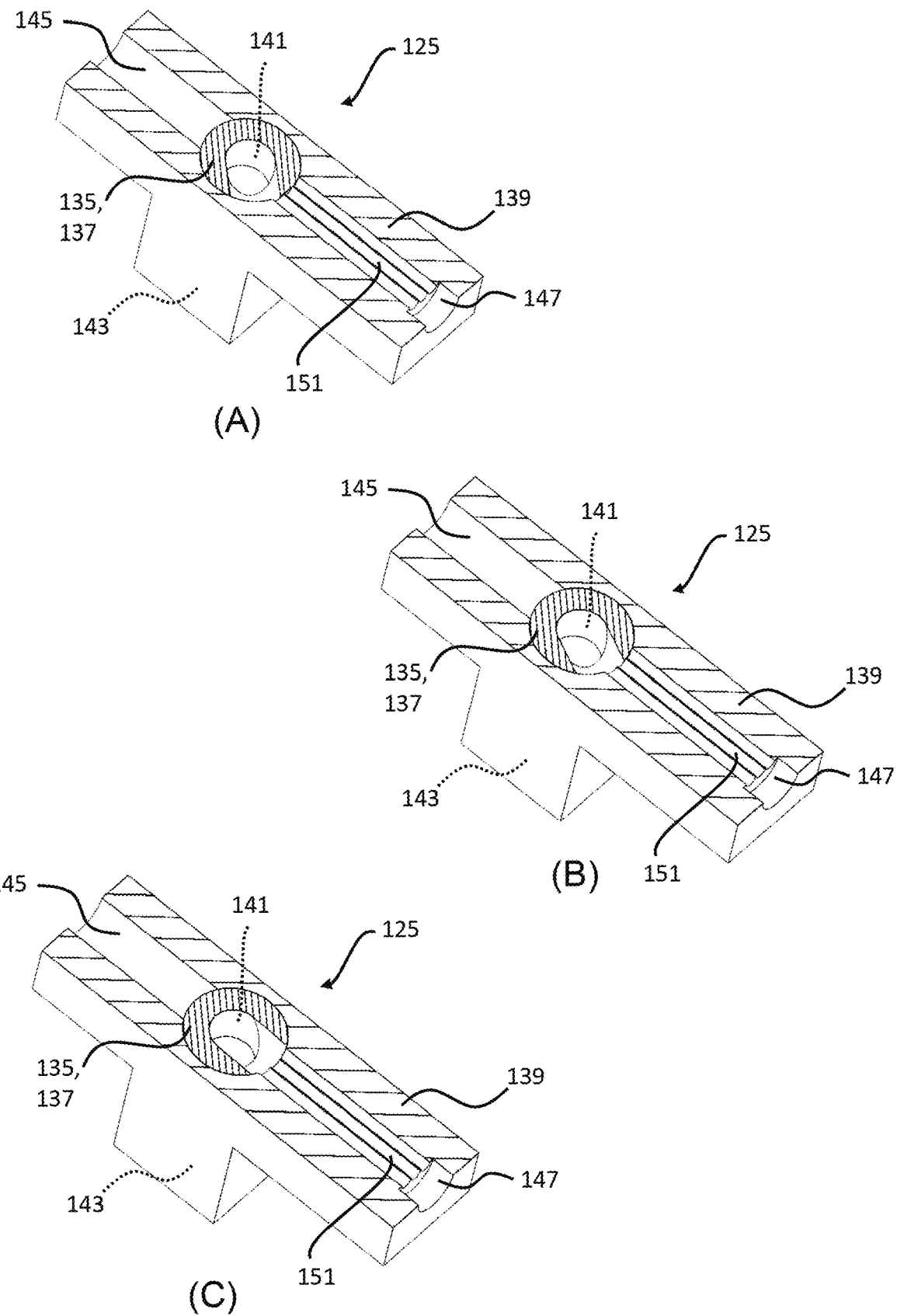
FIGS. 7A, 7B and 7C are schematic diagrams of a three-way by-pass valve of a cooling circuit according to an embodiment of the application.

FIGS. 7A, 7B and 7C are schematic diagrams of a three-way by-pass valve of a cooling circuit according to an example.

The first by-pass valve 125 shown in FIGS. 7A, 7B and 7C corresponds to the first by-pass valve 125 shown in FIGS. 5A and 5B, as well as FIGS. 6A and 6B, respectively, except that intermediate rotation positions between the first rotation position and the second rotation position of the ball element 137 during the active cooling mode are shown.

As it is shown in FIGS. 7A, 7B and 7C the first by-pass valve 125. i.e. the ball element 137, is adapted to at least partially open the second valve outlet 147 in a range between 1% and 99% based on the cross-section of the second valve outlet 147, more particular by about 10%, 20%, 30%, 40%, 50%, 60%, 70%, 80% or 90% based on the cross-section of the second valve outlet 147.

For example, in FIG. 7C it is shown that the ball element 137 of the first by-pass valve 125 is in a fully opened position, thereby not restricting the flow of cooling agent through the second valve outlet 147.

In FIG. 7B, for example, the ball element 137 of the first by-pass valve 125 is in a partially opened position for example by opening the second valve outlet 147 at about 60% based on the cross-section of the second valve outlet 147.

In FIG. 7A, for example, the ball element 137 of the first by-pass valve 125 is in a partially opened position for example by opening the second valve outlet 147 at about 30% based on the cross-section of the second valve outlet 147.

Figure 8:
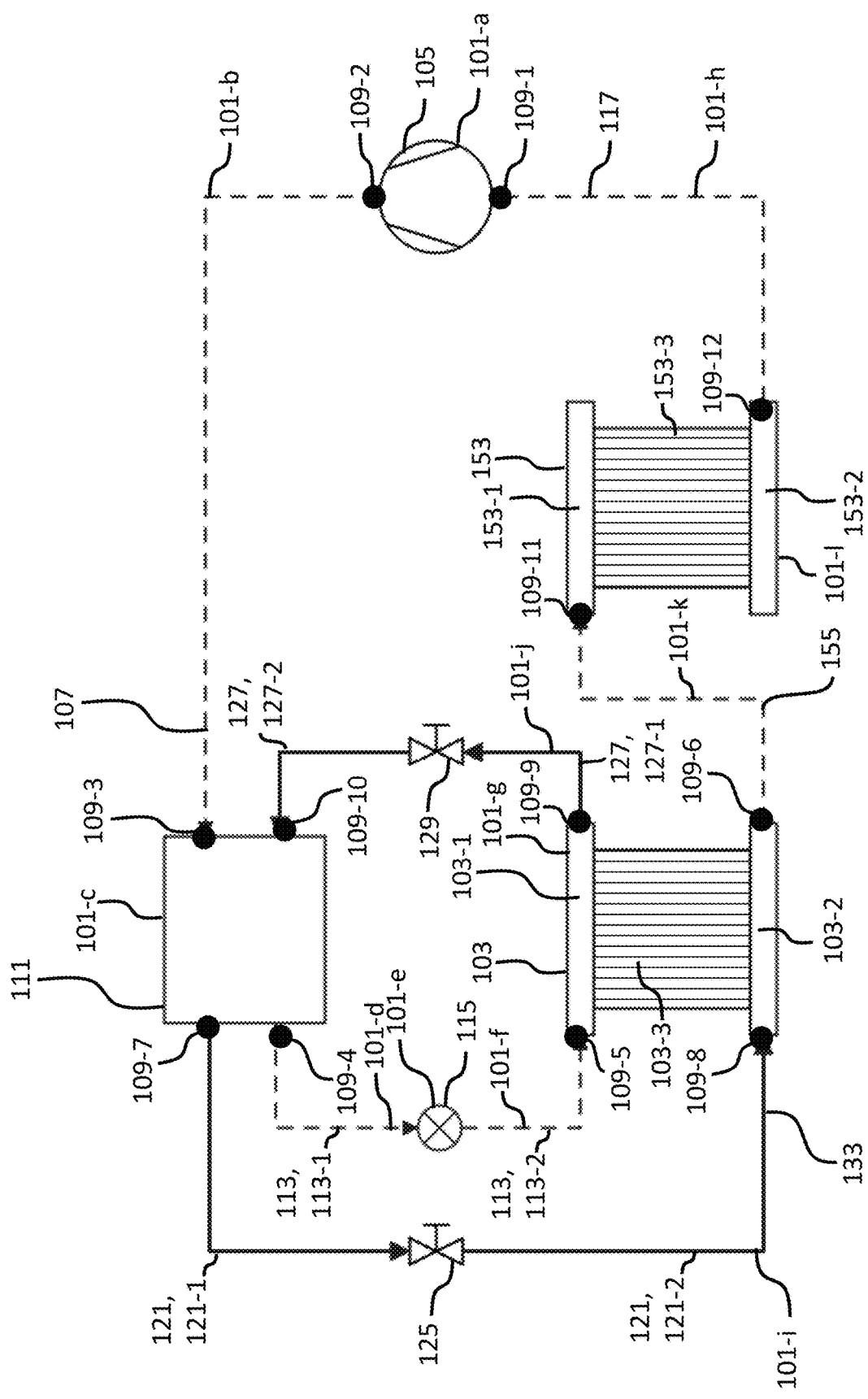
FIG. 8 is a schematic diagram of a cooling device comprising a cooling circuit during a passive cooling mode according to an embodiment of the application.

FIG. 8 is a schematic diagram of a cooling device 100 comprising a cooling circuit 101 during a passive cooling mode according to an example.

The example depicted in FIG. 8 is similar to the example depicted in FIG. 2 except for the difference that the cooling circuit 101 comprises an additional evaporator 153, which is arranged between the evaporator 103 and the compressor 105 in the cooling circuit 101.

The additional evaporator 153 comprises a top part 153-1, a bottom part 153-2, and a plurality of evaporating tubes 153-3 connecting the top part 153-1 with the bottom part 153-2. The top part 153-1 of the additional evaporator 153 is connected to the bottom part 103-2 of the evaporator 103 by a first evaporator connecting line 155 of the cooling circuit 101. The evaporator connecting line 155 forms an eleventh section 101-$k$ of the cooling circuit 101 and the additional evaporator 153 forms a twelfth section 101-$l$ of the cooling circuit 101. The bottom part 153-2 of the additional evaporator 153 is connected to the compressor 105 by the third fluid line 117.

During the passive cooling mode depicted in FIG. 8, the cooling agent is not circulated through the additional evaporator 153 and the compressor 105.

Similar to the example shown in FIG. 2, during the passive cooling mode according to the example shown in FIG. 8, the first by-pass valve 125 and the second by-pass valve 129 open the respective first fluid by-pass line 121 and second fluid by-pass line 127, thereby allowing a flow of liquid cooling agent from the condensing unit 111 and through the bottom part 103-2 of the evaporator 103 into the plurality of evaporating tubes 103-3 of the evaporator 103, wherein the liquid cooling agent is evaporated thereby forming gaseous cooling agent. Subsequently, the gaseous cooling agent is adapted to be transferred from the plurality of evaporating tubes 103-3 of the evaporator 103 through the top part 103-1 of the evaporator 103 and through the second fluid by-pass line 127 back to the condensing unit 111, thereby closing the cooling cycle.

During the passive cooling mode shown in FIG. 8 no superheating of the cooling agent is necessary so the additional evaporator 153 is not filled with liquid cooling agent. Instead the additional evaporator 153, since it is in contact with warmer ambient air, during the passive cooling model, the additional evaporator 153 is filled with superheated gaseous cooling agent and is non-active. This achieves the advantage that during the passive cooling mode the evaporation exclusive takes place in the evaporator 103 without any superheating regions, so the amount of cooling agent inside the evaporator 103 is maintained constant.

Figure 9:
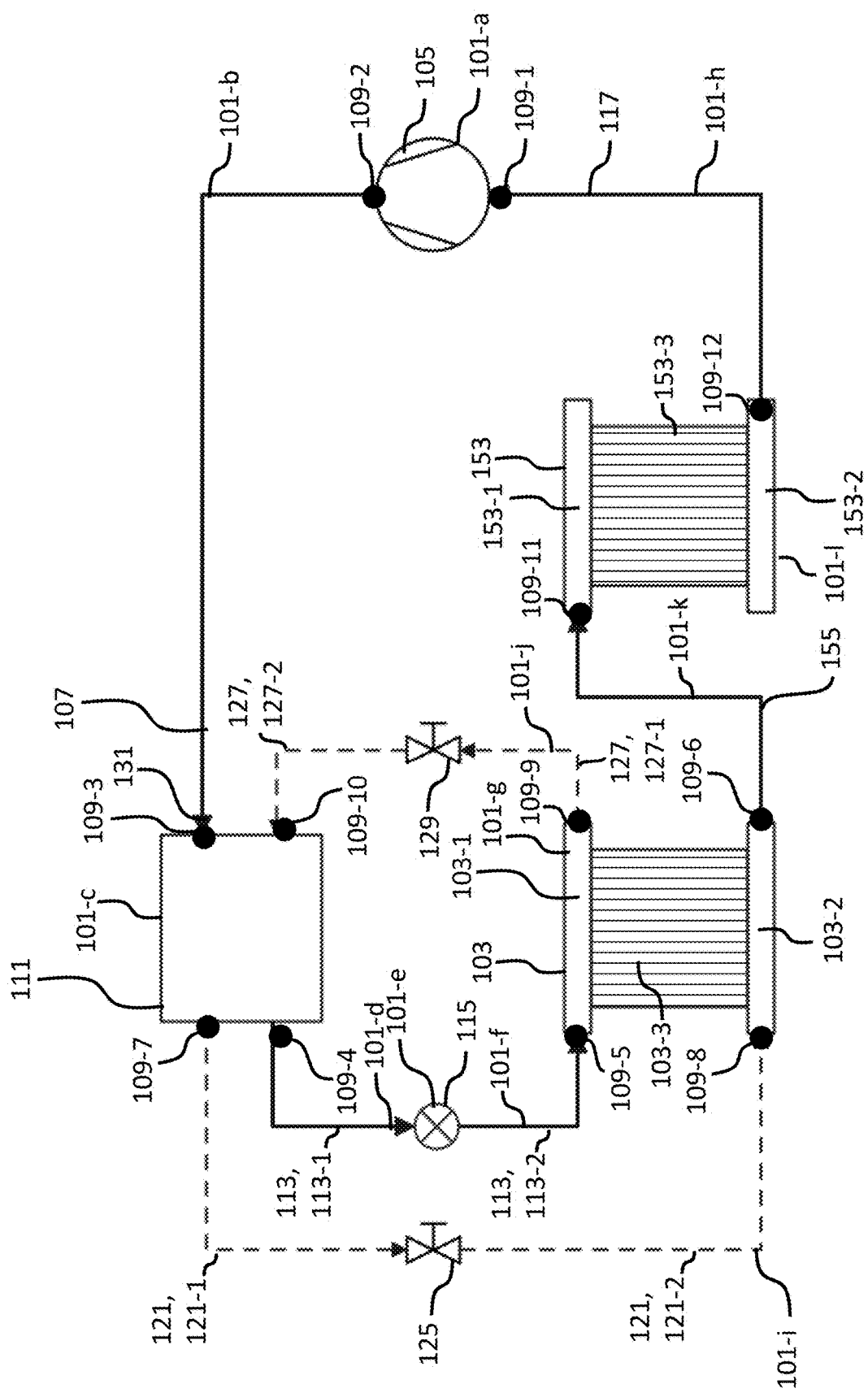
FIG. 9 is a schematic diagram of a cooling device comprising a cooling circuit during an active cooling mode according to an embodiment of the application.

FIG. 9 is a schematic diagram of a cooling device 100 comprising a cooling circuit 101 during an active cooling mode according to an example.

The cooling device 100 shown in FIG. 9 is identical to the cooling device 100 shown in FIG. 8 except that in FIG. 9 the active cooling mode is shown.

During the active cooling mode, the first by-pass valve 125 and the second by-pass valve 129 close the first fluid by-pass line 121 and the second fluid by-pass line 127, respectively.

So during the active cooling mode shown in FIG. 8 the cooling agent containing the lubricant oil is not directly adapted to be transferred from the bottom part 103-2 of the evaporator 103 to the compressor 105, but instead is adapted to be transferred from the bottom part 103-2 of the evaporator 103 through the first evaporator connecting line 155, through the top part 153-1 of the additional evaporator 153, through the evaporating tubes 153-3 of the additional evaporator 153, through the bottom part 153-2 of the additional evaporator 153, and through the third fluid line 117 back to the compressor 105.

The flow of warm ambient air through the interior of the cooling device 100 typically is adapted to be directed first towards the additional evaporator 153 and subsequently to the evaporator 103, so the temperature of ambient air contacting the evaporator 103 is typically less than the temperature of ambient air contacting the additional evaporator 153.

This results in that the temperature of liquid cooling agent flowing through the evaporator 103 is heated up within the plurality of evaporating tubes 103-3 to a temperature, which is very close to the temperature of evaporation of the cooling agent, but not exceeding the temperature of evaporation of the cooling agent, so the cooling agent flowing through the evaporator 103 is not fully evaporated, but for example the cooling agent can form a two-phase mixture comprising both liquid cooling agent and gaseous cooling agent.

When the not-fully evaporated cooling agent is adapted to subsequently flow through the additional evaporator 153 the cooling agent is fully evaporated and superheated within the additional evaporator 153 due to warmer ambient air, thereby increasing the efficiency of the evaporation process.

Figure 10:
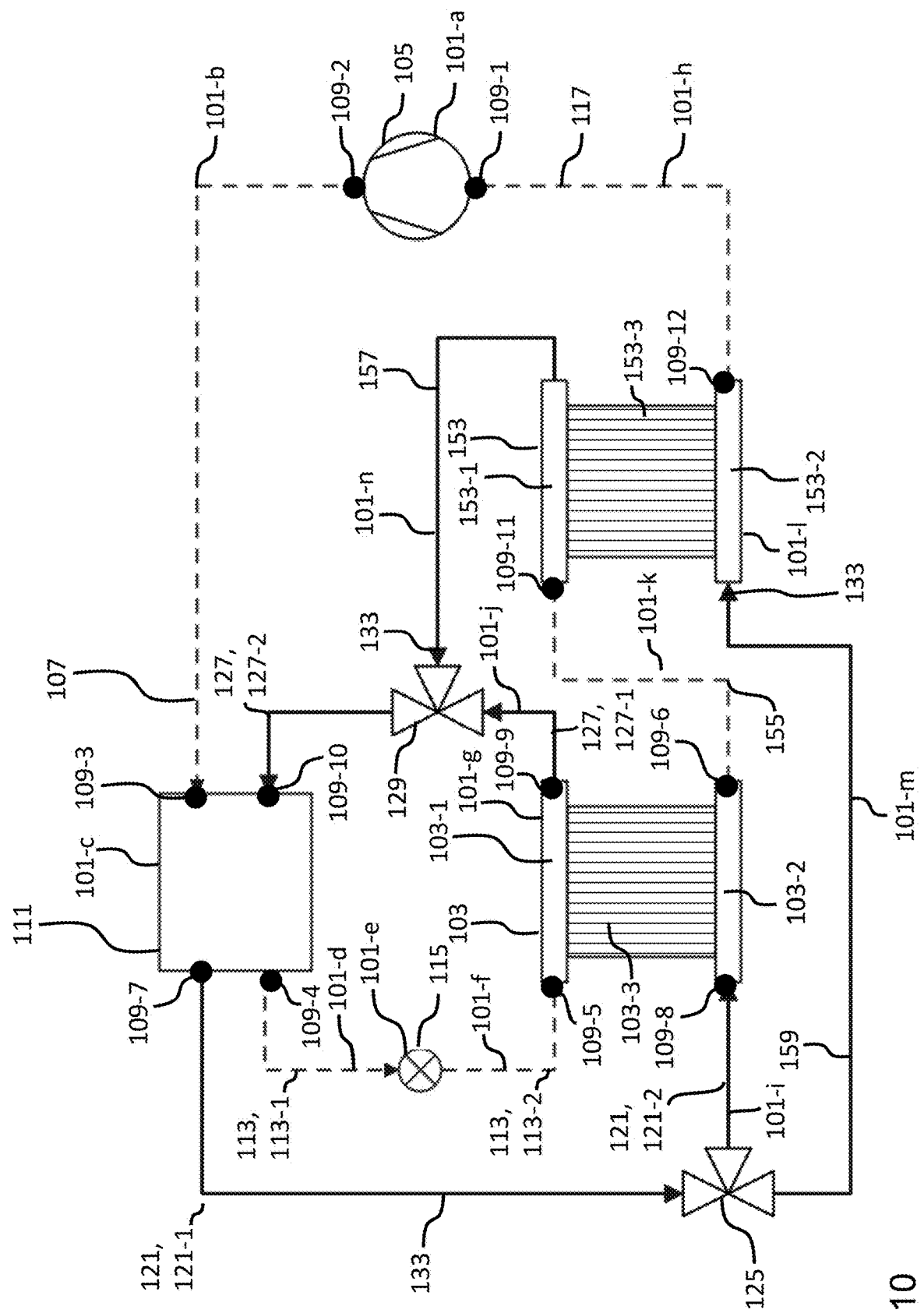
FIG. 10 is a schematic diagram of a cooling device comprising a cooling circuit during a passive cooling mode according to an embodiment of the application.

FIG. 10 is a schematic diagram of a cooling device comprising a cooling circuit during a passive cooling mode according to an example.

The cooling circuit 101 shown in the example according FIG. 10 is related to the cooling circuit 101 shown in the example according to FIG. 8 except for the following differences.

In the passive cooling mode shown in the example according to FIG. 10 both the evaporator 103 and the additional evaporator 153 are used for evaporating the cooling agent. Therefore, both the first by-pass valve 125 and the second by-pass valve 129 are formed as a respective three-way by-pass valve 125, 129, which allow for a fluid connection between the condensing unit 111 and both the evaporator 103 as well as the additional evaporator 153.

For a detailed structural depiction of the corresponding respective three-way by-pass valve 125, 129 a reference to the examples according to FIGS. 5A, 5B, 6A, 6B, 7A, 7B and 7C is provided.

As shown in FIG. 10, the first by-pass valve 125, which is formed as a three-way by-pass valve is connected to the condensing unit 111 by a first section 121-1 of the first fluid by-pass line 121 and is connected to the bottom part 103-2 of the evaporator 103 by a second section 121-2 of the first fluid by-pass line 121. Further, the first by-pass valve 125, which is formed as a three-way by-pass valve is connected to the bottom part 153-2 of the additional evaporator 153 by a third evaporator connecting line 159, which forms a thirteenth section 101-*m* of the cooling circuit 101.

As shown in FIG. 10, the second by-pass valve 129, which is formed as a three-way by-pass valve is connected to the condensing unit 111 by a second section 127-2 of the second fluid by-pass line 127 and is connected to the top part 103-1 of the evaporator 103 by a first section 127-1 of the second fluid by-pass line 127. Further, the second by-pass valve 129, which is formed as a three-way by-pass valve is connected to the top part 153-1 of the additional evaporator 153 by a second evaporator connecting line 157, which forms a fourteenth section 101-*n* of the cooling circuit 101.

As can be derived from the flow of cooling agent during the passive cooling mode shown with arrows 133, the liquid cooling agent is adapted to flow from the condensing unit 111 through both the evaporator 103 and the additional evaporator 153 in parallel, and the resulting evaporated cooling agent exiting the evaporator 103 and the additional evaporator 153 is merged in the second by-pass valve 129 before entering the condensing unit 111 again.

Therefore, due to employing both evaporators 103, 153 during the passive cooling mode, the efficiency of the passive cooling mode is enhanced.

Figure 11:
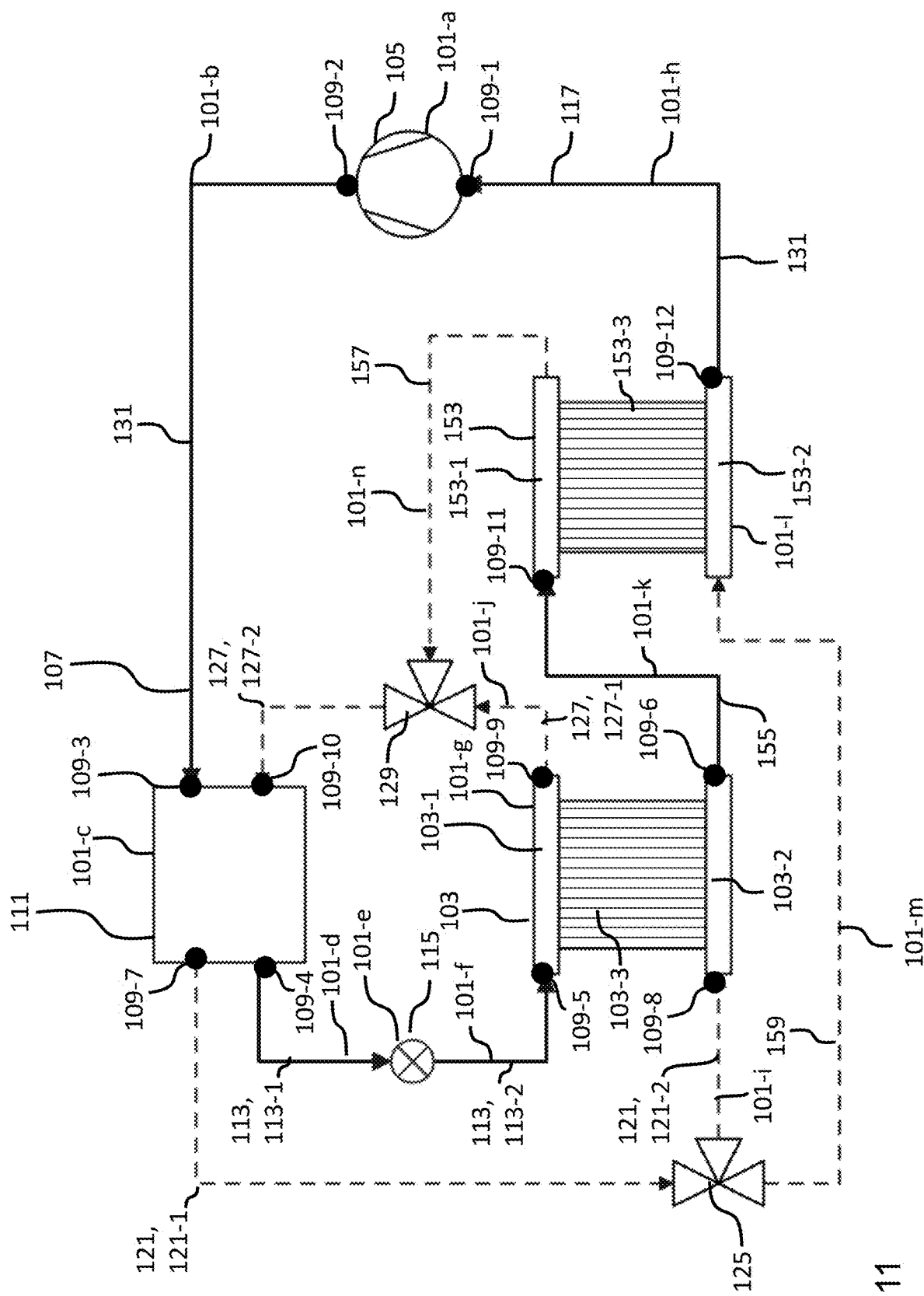
FIG. 11 is a schematic diagram of a cooling device comprising a cooling circuit during an active cooling mode according to an embodiment of the application.

FIG. 11 is a schematic diagram of a cooling device 100 comprising a cooling circuit 101 during an active cooling mode according to an example.

The cooling device 100 shown in FIG. 11 is identical to the cooling device 100 shown in FIG. 10 except that in FIG. 11 the active cooling mode is shown.

During the active cooling mode, the first by-pass valve 125 and the second by-pass valve 129 close the first fluid by-pass line 121 and the second fluid by-pass line 127, respectively.

So during the active cooling mode shown in FIG. 11 the cooling agent containing the lubricant oil is adapted to be transferred from the bottom part 103-2 of the evaporator 103 through the first evaporator connecting line 155, through the top part 153-1 of the additional evaporator 153, through the evaporating tubes 153-3 of the additional evaporator 153, through the bottom part 153-2 of the additional evaporator 153, and through the third fluid line 117 back to the compressor 105, similar to the active cooling mode shown in the example according to FIG. 9.

Figure 12:
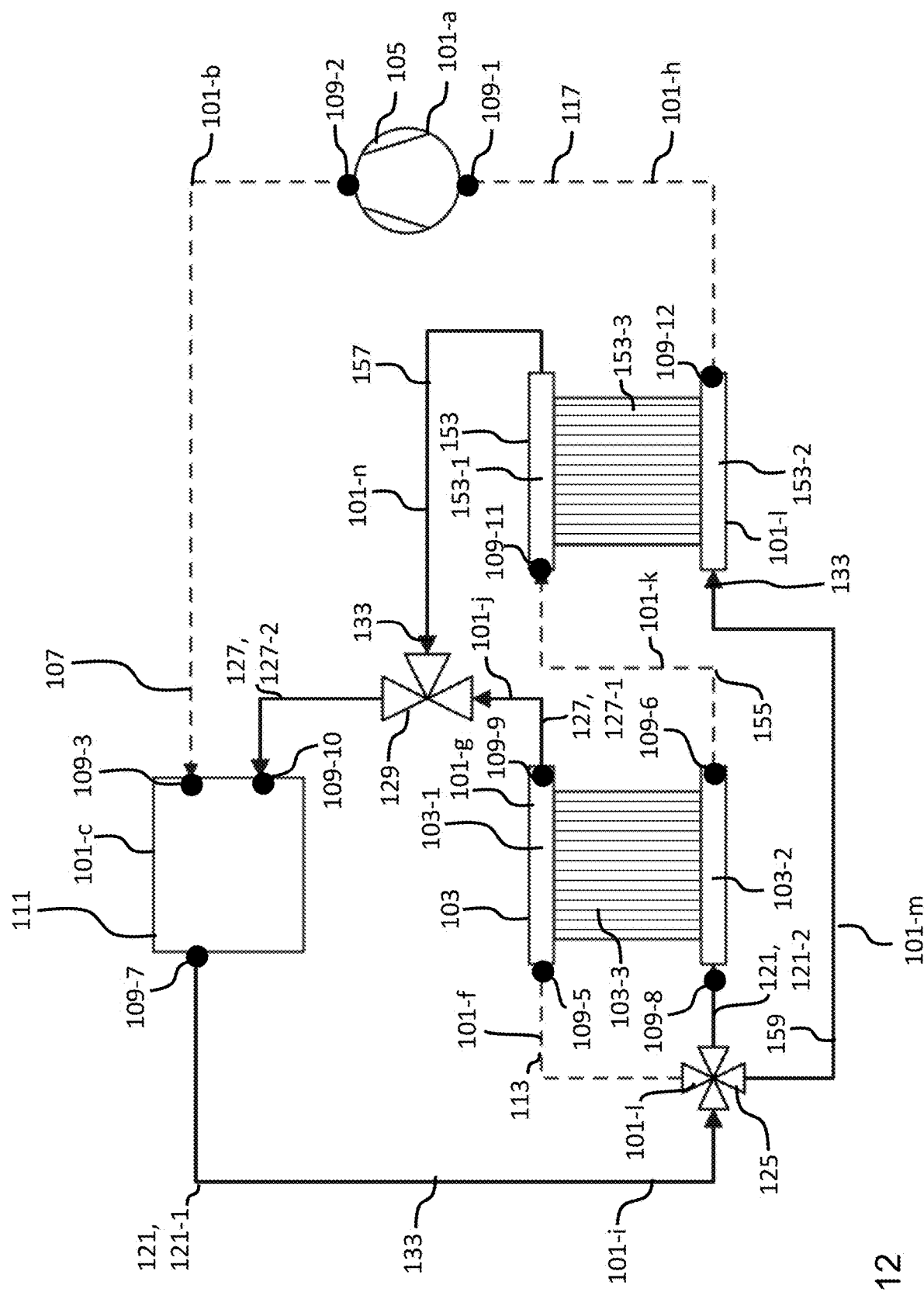
FIG. 12 is a schematic diagram of a cooling device comprising a cooling circuit during a passive cooling mode according to an embodiment of the application.

FIG. 12 is a schematic diagram of a cooling device comprising a cooling circuit during a passive cooling mode according to an example.

The cooling circuit 101 shown in the example according FIG. 12 is related to the cooling circuit 101 shown in the example according to FIG. 10 except for the following differences.

In example according to FIG. 12 the first by-pass valve 125 is formed as a four-way by-pass valve 125, which combines the function of the first by-pass valve 125 with the expanding device 115, which is not present in the cooling circuit 101 according to the example shown in FIG. 12.

As shown in FIG. 12, the first by-pass valve 125, which is formed as a four-way by-pass valve is connected to the condensing unit 111 by a first section 121-1 of the first fluid by-pass line 121 and is connected to the bottom part 103-2 of the evaporator 103 by a second section 121-2 of the first fluid by-pass line 121.

Further, the first by-pass valve 125, which is formed as a four-way by-pass valve is connected to the bottom part 153-2 of the additional evaporator 153 by a third evaporator connecting line 159. Further, the first by-pass valve 125, which is formed as a four-way by-pass valve is connected to the top part 103-1 of the evaporator 103 by the second fluid line 113.

The parallel flow of cooling agent through the evaporator 103 and through the additional evaporator 153 during the passive cooling mode as shown in the example according to FIG. 12 is similar to the corresponding flow of cooling agent shown in the example according to FIG. 10.

Even if not shown in FIG. 12, the cooling device 100 in particular can comprise a control 134 and a sensor arrangement 136 similar to the example shown in FIG. 3, wherein said sensor arrangement 136 is adapted to detect a superheat of the cooling agent flowing through the third fluid line 117, and wherein the control 134 is adapted to operate the first by-pass valve 125, which is formed as a four-way by-pass valve, in dependence of the detected superheat of the cooling agent.

Figure 13:
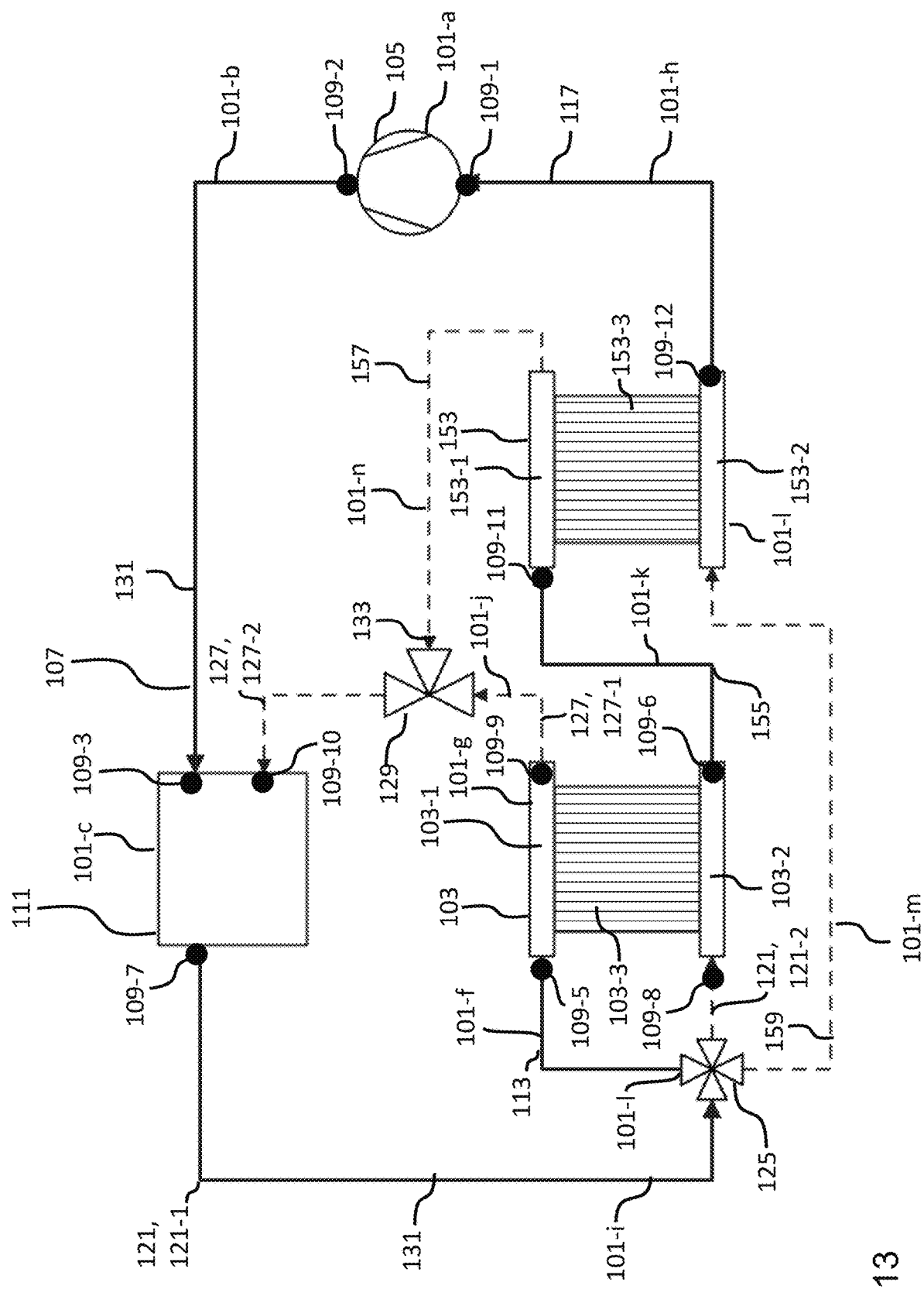
FIG. 13 is a schematic diagram of a cooling device comprising a cooling circuit during an active cooling mode according to an embodiment of the application.

FIG. 13 is a schematic diagram of a cooling device comprising a cooling circuit during an active cooling mode according to an example;

The cooling device 100 shown in FIG. 13 is identical to the cooling device 100 shown in FIG. 12 except that in FIG. 13 the active cooling mode is shown.

During the active cooling mode, the first by-pass valve 125 and the second by-pass valve 129 close the first fluid by-pass line 121 and the second fluid by-pass line 127, respectively.

Since the function of the expanding device 115 is incorporated into the first by-pass valve 125, which is formed as a four-way by-pass valve 125, the first by-pass valve 125, in particular a third outlet 167 of the first by-pass valve 125, which is connected to the top part 103-1 of the evaporator 103 comprises a plurality of microchannel 151, which are adapted to expand the liquid cooling agent before entering the evaporator 103. For further details in this respect reference to FIGS. 14A and 14B is provided.

So during the active cooling mode shown in FIG. 13 the cooling agent containing the lubricant oil is adapted to be transferred from the condensing unit 111 through the first by-pass valve 125, which is formed as a four way by-pass valve 125, and through the second fluid line 113 to the top part 103-1 of the evaporator 103, through the evaporating tubes 103-3 of the evaporator 103, through the bottom part 103-2 of the evaporator 103, through the first evaporator connecting line 155, through the top part 153-1 of the additional evaporator 153, through the evaporating tubes 153-3 of the additional evaporator 153, through the bottom part 153-2 of the additional evaporator 153, and through the third fluid line 117 back to the compressor 105, similar to the active cooling mode shown in the example according to FIG. 11.

Figure 14:
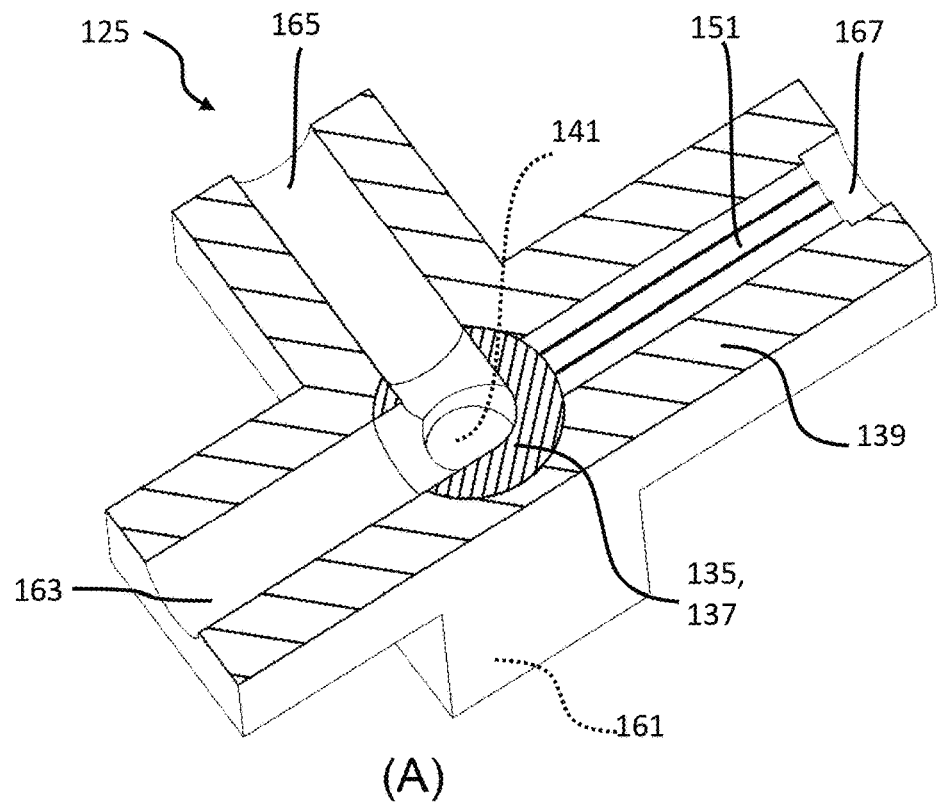
FIGS. 14A and 14B are schematic diagrams of a four-way by-pass valve of a cooling circuit according to an embodiment of the application.
Figure 14:
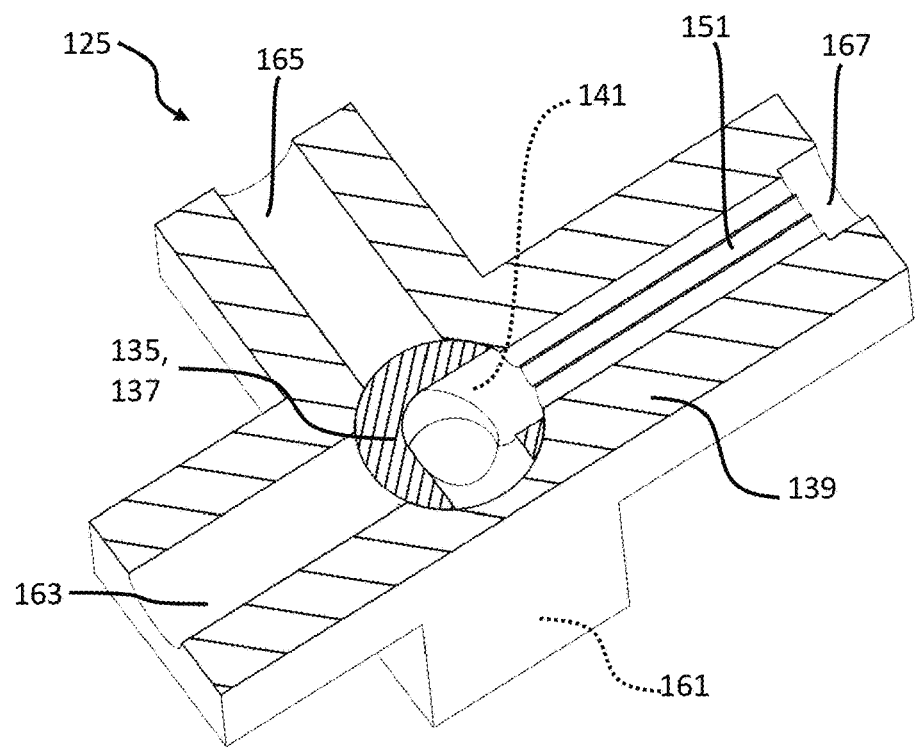

FIGS. 14A and 14B are schematic diagrams of a four-way by-pass valve of a cooling circuit according to an example.

In an embodiment, the four-way by-pass valve shown in FIGS. 14A and 14B corresponds to the first by-pass valve 125 shown in FIGS. 12 and 13.

The first by-pass valve 125, which is formed as a four-way by-pass valve 125, comprises a valve inlet 161, which is connected to the condensing unit 111 by a first section 113-1 of the second fluid line 113. The first by-pass valve 125 comprises a first valve outlet 163, which is connected to the bottom part 103-2 of the evaporator 103 by the first fluid by-pass line 121. The first by-pass valve 125 comprises a second valve outlet 165, which is connected to the bottom part 153-2 of the additional evaporator 153 by a third evaporator connecting line 159.

The first by-pass valve 125 comprises a third valve outlet 167, which is connected to the top part 103-1 of the evaporator 103 by the second fluid line 113. As shown in FIGS. 14A and 14B the third valve outlet 167 comprises a plurality of microchannels 151, which are adapted to expand the liquid cooling agent conducted through them.

The first by-pass valve 125 shown in FIGS. 14A and 14B is formed as a ball valve comprising a ball element 137, which is received in a ball housing 139.

The ball element 137 is rotatable between a first rotation position and a second rotation position, wherein in FIG. 14A the second rotation position is depicted and wherein in FIG. 14B the first rotation position is depicted. In an embodiment, the second rotation position depicted in FIG. 14A corresponds to the operation of the cooling device 100 during the passive cooling mode. In an embodiment, the first rotation position depicted in FIG. 14B corresponds to the operation of the cooling device 100 during the active cooling mode.

In an embodiment, the ball element 137 comprises a rotation shaft 149 not shown in FIGS. 14A and 14B, which penetrates the ball housing 139, wherein the rotation shaft 149 is drivable by a motor of the ball valve in order to rotate the ball element 137 between the first rotation position and the second rotation position.

Similar to the intermediate positions of the ball element 137 shown in the examples according to FIGS. 7A, 7B and 7C also the ball element 137 shown in the examples according to FIGS. 14A and 14B can be switched into intermediate positions between the first and second rotation position, thereby regulating the flow rate of liquid cooling agent flowing through the microchannels 151 within the third valve outlet 167.

Figure 15:
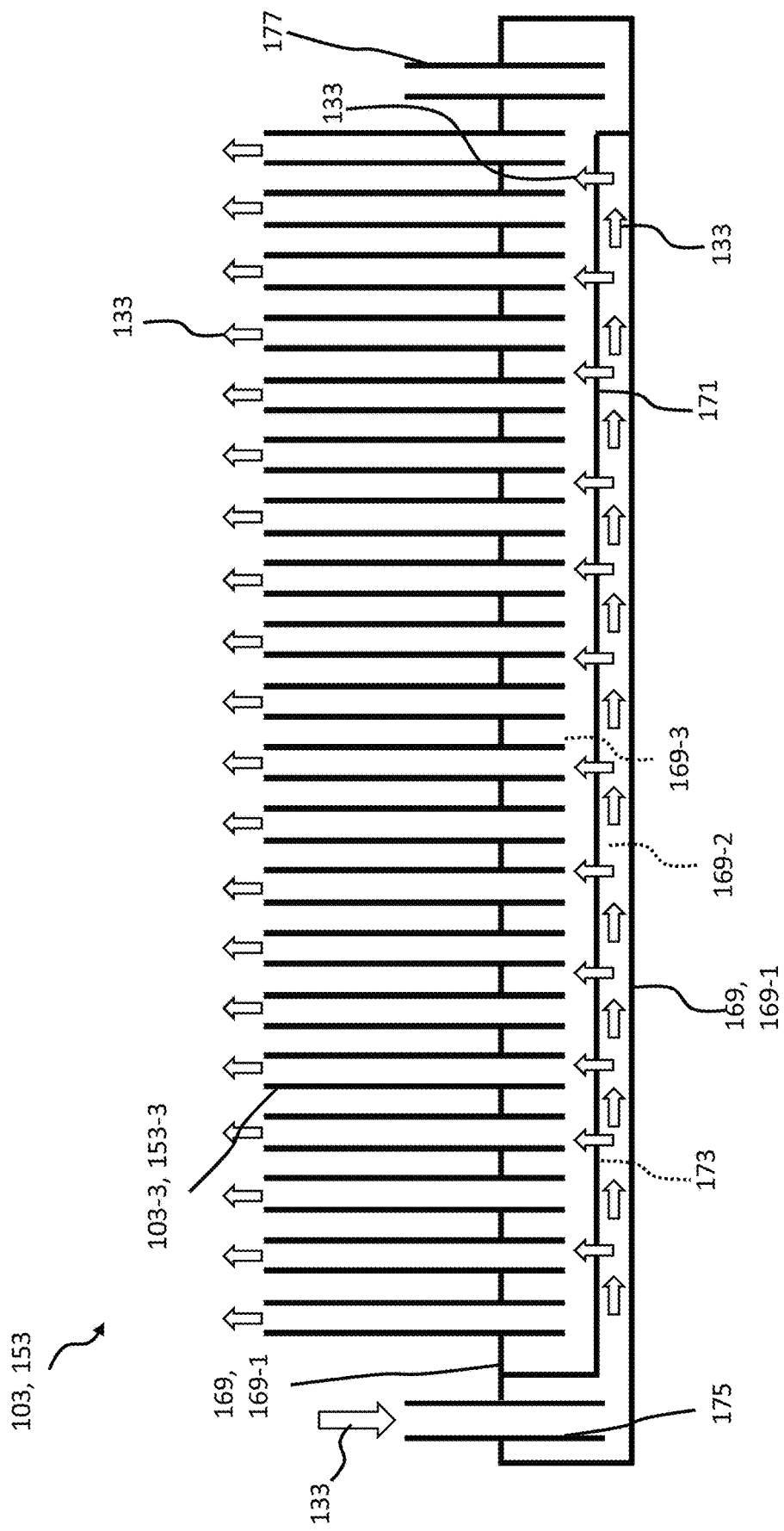
FIG. 15 is a schematic diagram of a collecting portion of an evaporator of a cooling circuit during a passive cooling mode according to an embodiment of the application.

FIG. 15 is a schematic diagram of a collecting portion of an evaporator of a cooling circuit during a passive cooling mode according to an example.

In an embodiment, the collecting portion 169 shown in FIG. 15 can be a part of the evaporator 103 and/or additional evaporator 153 according to the previous examples.

As shown in FIG. 15, the bottom part 103-2 of the evaporator 103 and/or the bottom part 153-2 of the additional evaporator 153 comprises a collecting portion 169, respectively, which is connected by the plurality of evaporating tubes 103-3 of the evaporator 103 and/or by the plurality of evaporating tubes 153-3 of the additional evaporator 153 with the top part 103-1 of the evaporator 103 and/or with the top part 153-1 of the additional evaporator 153, wherein said top part 103-1, 153-1 is not shown in FIG. 15.

The collecting portion 169 comprises a separating element 171, which separates a lower part 169-2 of the collecting portion 169 from an upper part 169-3 of the collecting portion 169. The upper part 169-3 is connected to the plurality of evaporating tubes 103-3, 153-3.

Between the separating element 171 and a wall 169-1 of the collecting portion 169 at least one opening 173 is formed for conducting cooling agent from the lower part 169-2 to the upper part 169-3 of the collecting portion 169 during a passive cooling mode. The at least one opening 173 is only schematically shown in FIG. 15 and for further details reference to FIG. 16 is provided.

In the passive cooling mode shown in FIG. 15 the cooling agent is adapted to enter the lower part 169-2 of the collecting portion 169 through an inlet tube 175 and is adapted to flow from the lower part 169-2 of the collecting portion 169, through the at least one opening 173, into the upper part 169-3 of the collecting portion 169 and from there through the plurality of evaporating tubes 103-3, 153-3 into the top part 103-1, 153-1 of the evaporator 103 and/or additional evaporator 153.

Therefore, an effective flow of cooling agent during the passive cooling mode could be ensured.

Figure 16:
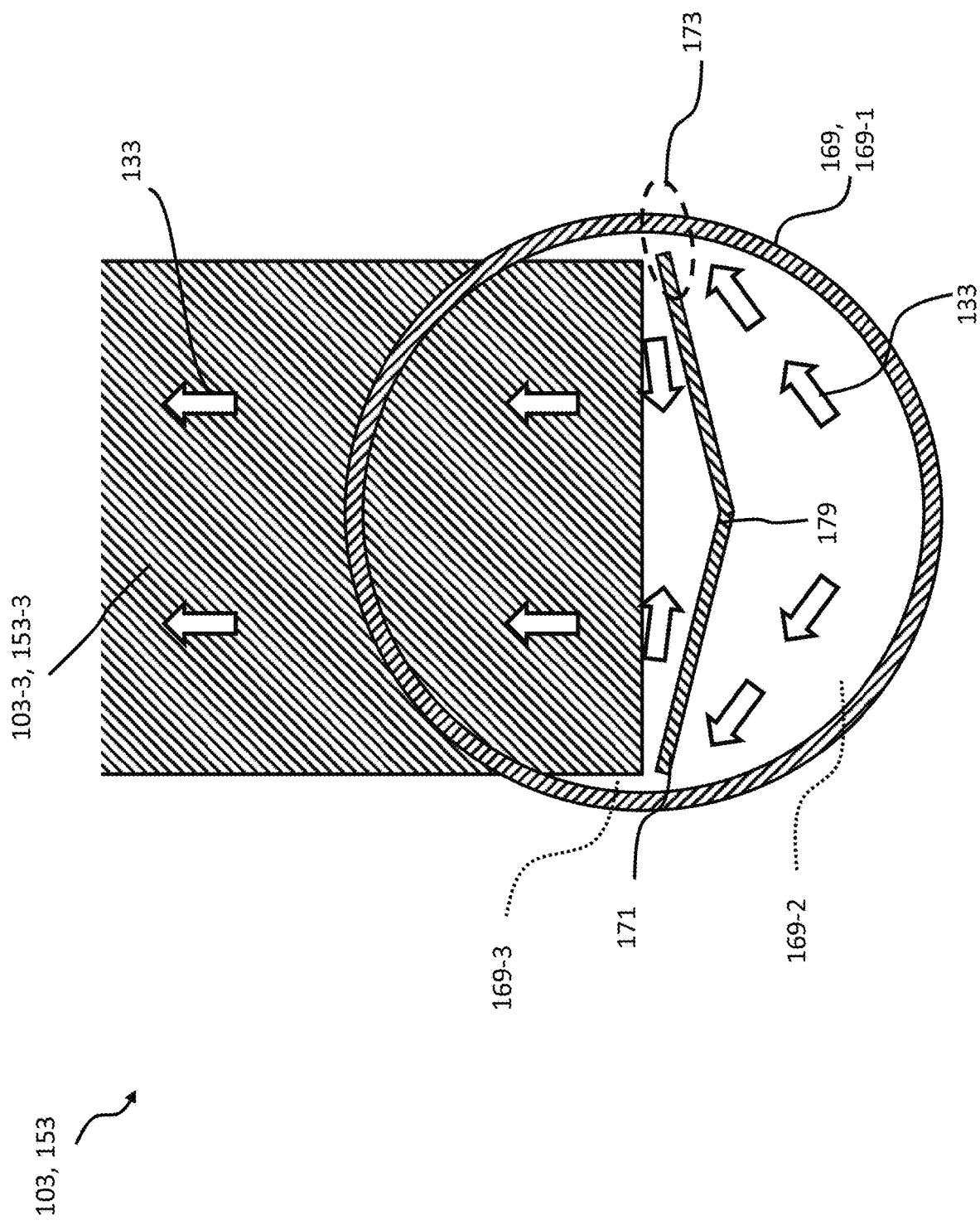
FIG. 16 is a schematic diagram of a collecting portion of an evaporator of a cooling circuit during a passive cooling mode according to an embodiment of the application.

FIG. 16 is a schematic diagram of a collecting portion of an evaporator of a cooling circuit during a passive cooling mode according to an example.

In FIG. 16 a schematic cross-section through the collecting portion 169 according to FIG. 15 is shown.

In FIG. 16 the separation of the upper part 169-3 and the lower part 169-2 of the collecting portion 169 by the separating element 171 is depicted, wherein the at least one opening 173, in particular two openings 173, between the separating element 171 and a wall 169-1 of the collecting portion 169 allows for an effective flow of cooling agent from the collecting portion 169 further into the plurality of evaporating tubes 103-3, 153-3.

Figure 17:
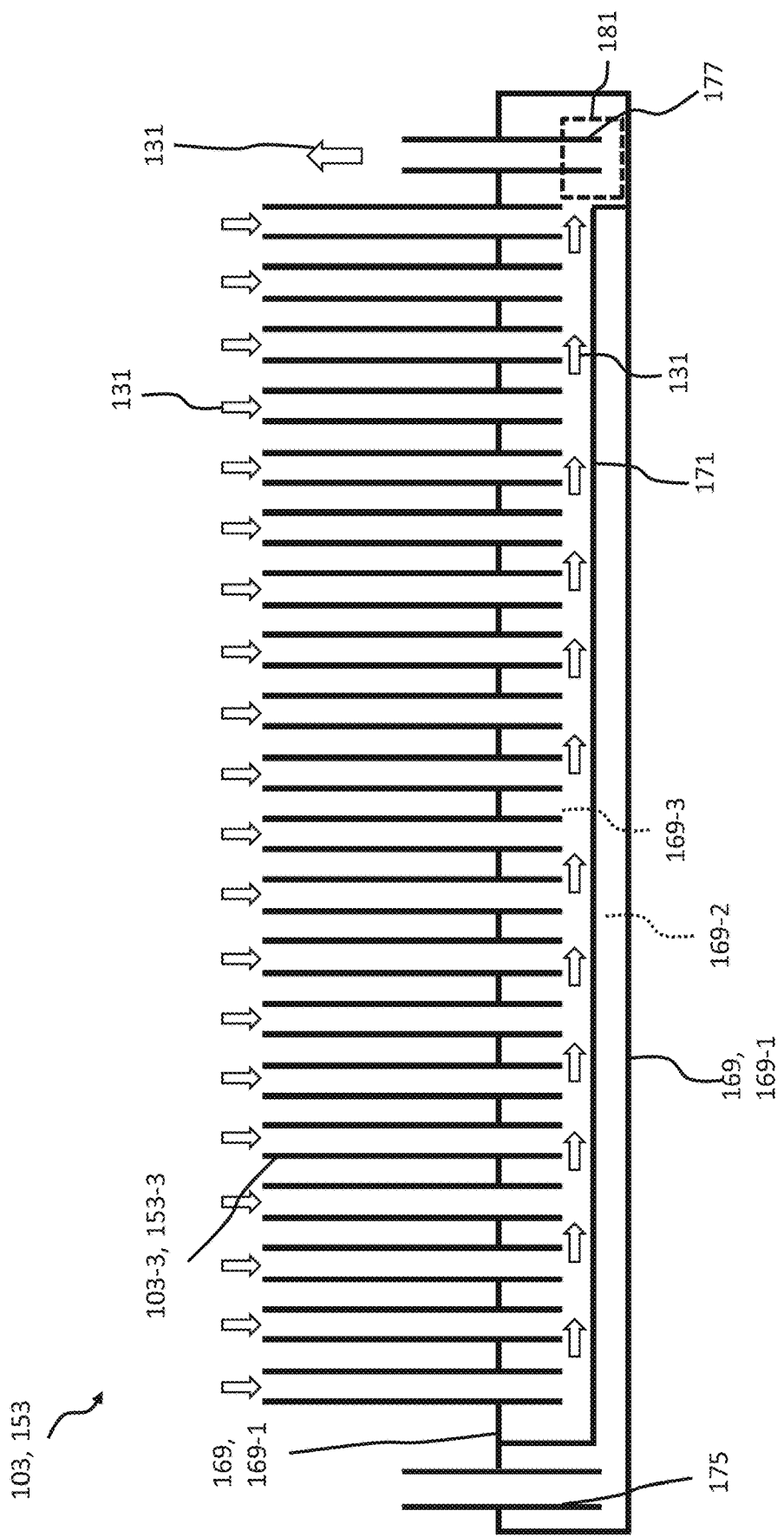
FIG. 17 is a schematic diagram of a collecting portion of an evaporator of a cooling circuit during an active cooling mode according to an embodiment of the application.

FIG. 17 is a schematic diagram of a collecting portion of an evaporator of a cooling circuit during an active cooling mode according to an example.

The collecting portion 169 shown in the example according to FIG. 17 is identical to the collecting portion shown in the example according to FIG. 15 and FIG. 16 except that in the example according to FIG. 17 the active cooling mode is shown.

In the active cooling mode according to the example shown in FIG. 17 cooling agent is adapted to flow from the top part 103-1, 153-1 of the evaporator 103 and/or additional evaporator 153 through the plurality of evaporating tubes 103-3, 153-3 to the upper part 169-3 of the collecting portion 169, so that the direction of flow 131 of the cooling agent through the evaporating tubes 103-3, 153-3 during the active cooling mode is opposite to the direction of flow 133 of the cooling agent through the evaporating tubes 103-3, 153-3 during the passive cooling mode.

As can be seen in the example according to FIG. 17, the separating element 171 is adapted to convey the cooling agent along its upper surface towards an outlet tube 177 of the collecting portion 169, wherein said outlet 177 is connected to the third fluid line 117 or to the first evaporator connecting line 155.

During evaporation within the plurality of evaporating tubes 103-3, 153-3 the lubricant oil is physically separated from the evaporated cooling agent and is adapted to drop down within the evaporating tubes 103-3, 153-3 towards the separating element 171 due to the force of gravity. The lubricant oil is adapted to be conducted along the surface of the separating element 171 towards an oil receiving portion 181, which is formed in the collecting portion 169. In an embodiment, the separating element 171 is shaped and/or is inclined in a way to facilitate the flow of lubricant oil along the surface of the separating element 171. In an embodiment, the separating element 171 comprises a recess, which is not shown in FIG. 17, to facilitate the flow of lubricant oil along the surface of the separating element 171. For further details in respect to the recess reference to FIG. 18 is provided.

As can been seen in FIG. 17, the outlet tube 177 extends partially into the oil receiving portion 181, so that gaseous cooling agent exciting the outlet tube 177 during the active cooling mode is adapted to flow through the lubricant oil received in the oil receiving portion 181, and thereby moving the lubricant oil from the oil receiving portion 181 to the third fluid line 117.

Figure 18:
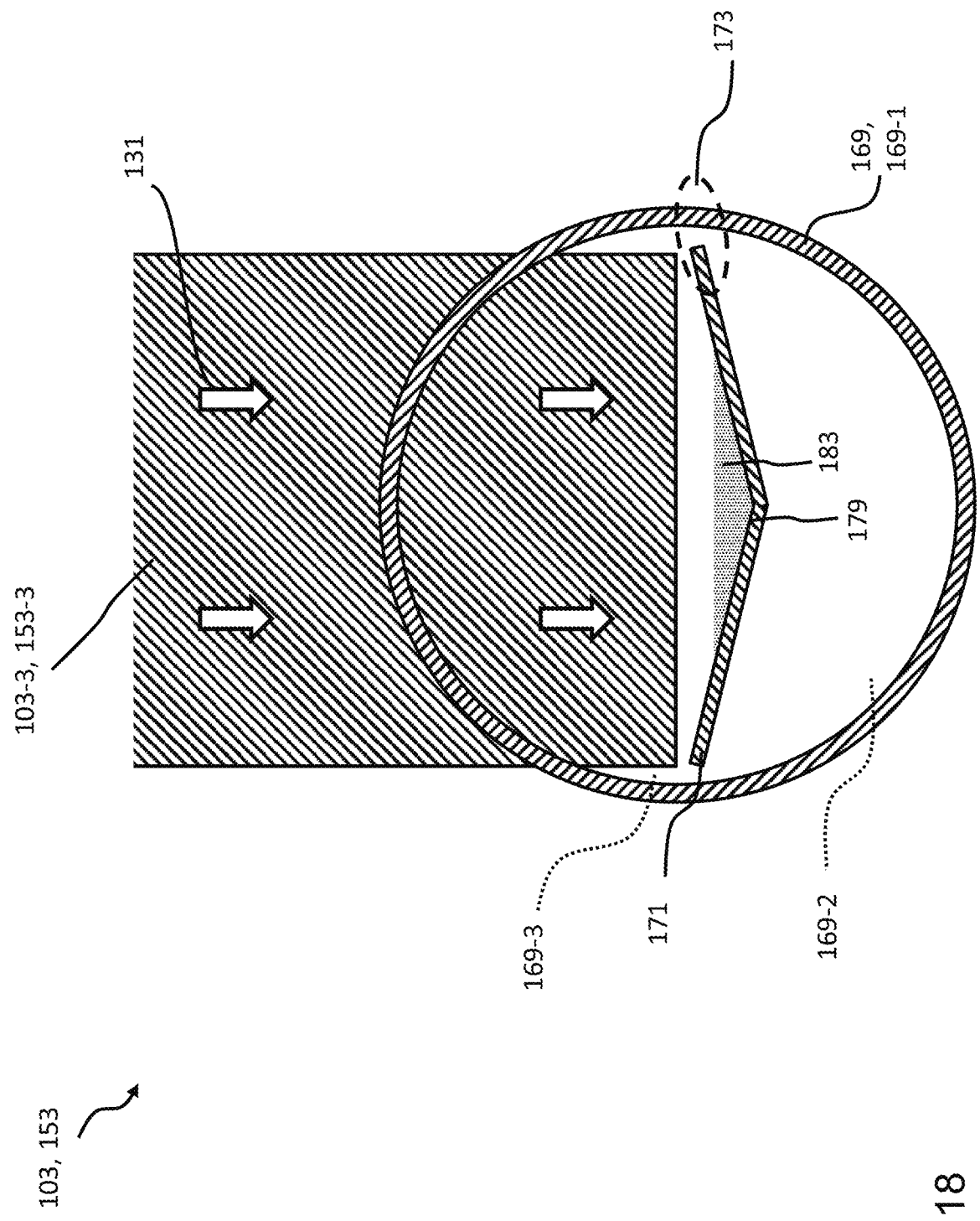
FIG. 18 is a schematic diagram of a collecting portion of an evaporator of a cooling circuit during an active cooling mode according to an embodiment of the application.

FIG. 18 is a schematic diagram of a collecting portion of an evaporator of a cooling circuit during an active cooling mode according to an example.

In FIG. 18 a schematic cross-section through the collecting portion 169 according to FIG. 17 is shown.

In FIG. 18 the separation of the upper part 169-3 and the lower part 169-2 of the collecting portion 169 by the separating element 171 is depicted, wherein a recess 179 is formed in the separating element 171, wherein during the active cooling mode shown in FIG. 18, said recess 179 is adapted to convey lubricant oil 183 from the recess 179 into an oil receiving portion 181 of the colleting portion 169, which is not shown in FIG. 18.

Figure 19:
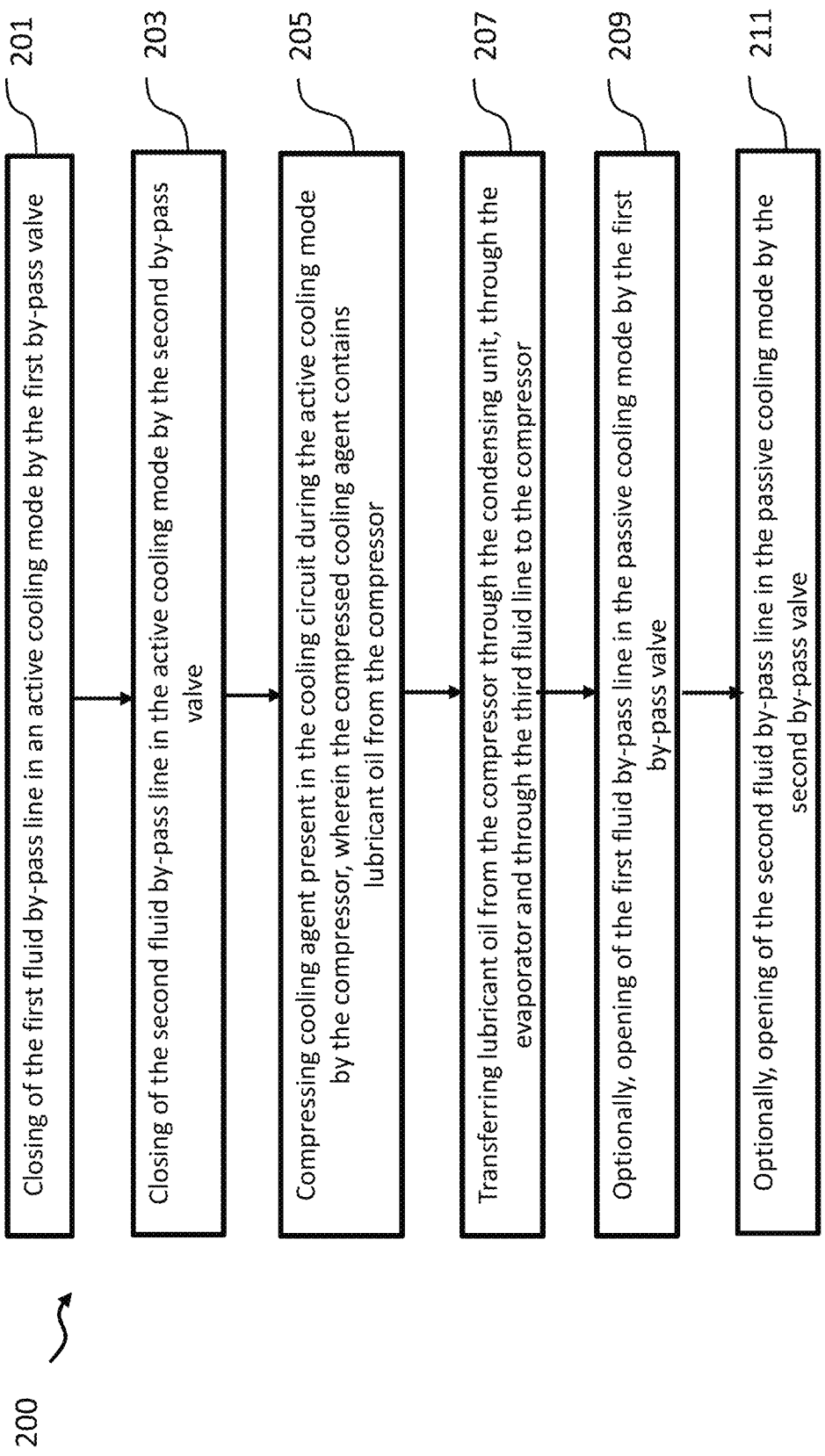
FIG. 19 is a flow diagram illustrating a method for cooling according to an embodiment of the application.

FIG. 19 is a flow diagram illustrating a method 200 for cooling according to an example.

The method 200 comprises the operations of:

Closing 201 of the first fluid by-pass line 121 in an active cooling mode by the first by-pass valve 125.

Closing 203 of the second fluid by-pass line 127 in an active cooling mode by the first by-pass valve 129.

Compressing 203 cooling agent present in the cooling circuit 101 during the active cooling mode by the compressor 105, wherein the compressed cooling agent contains lubricant oil from the compressor 105.

Transferring 207 lubricant oil from the compressor 105 through the condensing unit 111, through the evaporator 103 and through the third fluid line 117 back to the compressor 105 in the active cooling mode.

In an embodiment, the method 200 comprising the following optional method operations of opening 209 of the first fluid by-pass line 121 in a passive cooling mode by the first by-pass valve 125, and opening 211 of the second fluid by-pass line 127 in the passive cooling mode by the second by-pass valve 129, so that the cooling agent is adapted to directly flow from the condensing unit 111 through the first fluid by-pass line 121 to the evaporator 103, and through the second fluid by-pass line 127 back to the condensing unit 111.

Further features of the method 200 result directly from the structure and/or functionality of the cooling device 100, respectively cooling circuit 101 as well as its different examples described above.

The person skilled in the art will understand that the "blocks" ("units") of the various figures (method and apparatus) represent or describe functionalities of examples of the disclosure (rather than necessarily individual "units" in hardware or software) and thus describe equally functions or features of apparatus examples as well as method examples (unit=operation).

In the several examples provided in the disclosure, it should be understood that the disclosed apparatus, and method may be implemented in other manners. For example, the described examples of an apparatus are merely exemplary.

What is claimed is:

1. A cooling device comprising:
   a compressor operable to cooling agent in the cooling device during an active cooling mode, wherein the compressed cooling agent contains lubricant oil from the compressor;
   a condensing unit connected to the compressor by a first fluid line of the cooling device, wherein the condensing unit forms a section of the cooling device;
   an evaporator comprising a first part, a second part, and a plurality of evaporating tubes connecting the first part with the second part, wherein the first part is connected to the condensing unit by a second fluid line of the cooling device, and wherein the second part is connected to the compressor by a third fluid line of the cooling device, wherein during the active cooling mode, the lubricant oil is transferred from the compressor through the condensing unit, through the evaporator, and through the third fluid line back to the compressor;
   a first fluid by-pass line coupling the condensing unit with the second part of the evaporator, wherein the first fluid by-pass line comprises a first by-pass valve; and
   a second fluid by-pass line coupling the first part of the evaporator with the condensing unit, wherein the second fluid by-pass line is oriented vertically in the cooling device, wherein the second fluid by-pass line comprises a second by-pass valve, wherein the first by-pass valve and the second by-pass valve are operable to close the first fluid by-pass line and the second fluid by-pass line in the active cooling mode, respectively,
   wherein the lubricant oil is separated from compressed gaseous cooling agent by gravity, wherein the lubricant oil drops down in the vertically oriented second fluid by-pass line, and wherein the compressed gaseous cooling agent rises up in the vertically oriented second fluid by-pass line due to pressure applied to the compressed gaseous cooling agent by the compressor.

2. The cooling device according to claim 1, wherein the lubricant oil is transferred from the compressor through the evaporator including the first part of the evaporator, the plurality of evaporating tubes, and the second part of the evaporator.

3. The cooling device according to claim 1, wherein in the active cooling mode the compressor is compresses gaseous cooling agent, wherein the compressed gaseous cooling agent is conducted together with the lubricant oil through the first fluid line to the condensing unit, wherein the condensing unit condenses the compressed gaseous cooling agent, and obtains liquid cooling agent, wherein the liquid cooling agent is conducted together with the lubricant oil through the second fluid line to the evaporator, wherein the evaporator evaporates the liquid cooling agent, and obtains the gaseous cooling agent, and wherein the gaseous cooling agent is conducted together with the lubricant oil through the third fluid line back to the compressor.

4. The cooling device according to claim 1, wherein in the active cooling mode the first by-pass valve and the second by-pass valve are adapted to completely close the first fluid by-pass line and the second fluid by-pass line, respectively, or wherein in the active cooling mode the first by-pass valve is adapted to completely close the first fluid by-pass line and the second by-pass valve is adapted to partially close the second fluid by-pass line, by decreasing the cross-section of the second fluid by-pass line between 1% and 99%.

5. The cooling device according to claim 1, wherein in a passive cooling mode the compressor is adapted to be deactivated, wherein in the passive cooling mode the first by-pass valve and the second by-pass valve are adapted to open the first fluid by-pass line and the second fluid by-pass line, respectively, and wherein in the passive cooling mode the cooling agent is adapted to directly flow from the condensing unit through the first fluid by-pass line, through the evaporator, through the second fluid by-pass line back to the condensing unit.

6. The cooling device according to claim 1, wherein the second fluid by-pass line is connected to the first fluid line by a separating portion, and wherein the separating portion is adapted to physically separate lubricant oil from the compressed cooling agent during the active cooling mode, so that the lubricant oil is collected in the second fluid by-pass line.

7. The cooling device according to claim 1, further comprising an expansion device arranged in the second fluid line, wherein the expansion device is connected to the condensing unit by a first section of the second fluid line, and wherein the expansion device is connected to the evaporator by a second section of the second fluid line.

8. The cooling device according to claim 1, wherein the first by-pass valve is formed as a three-way by-pass valve arranged in the second fluid line, the first by-pass valve comprising a valve inlet connected to the condensing unit by a first section of the second fluid line, a first valve outlet connected to the second part of the evaporator by the first fluid by-pass line, and a second valve outlet connected to the first part of the evaporator by a second section of the second fluid line, and a moveable valve body is adapted to close the first valve outlet in the active cooling mode, in order to connect the valve inlet with the second valve outlet, and adapted to close the second valve outlet in the passive cooling mode, in order to connect the valve inlet with the first valve outlet.

9. The cooling device according to claim 8, wherein the valve body is formed as a ball element received in a ball housing of the first by-pass valve, wherein the ball element is rotatable between a first rotation position and a second rotation position, wherein the ball element comprises a channel for conducting cooling agent through the ball element in order to connect the valve inlet with the second valve outlet in the first rotation position and to connect the valve inlet with the first valve outlet in the second rotation position.

10. The cooling device according to claim 1, further comprising a control, wherein the third fluid line comprises a sensor arrangement adapted to detect a superheat of the cooling agent flowing through the third fluid line, and wherein the control is adapted to operate the first by-pass valve based on the detected superheat of the cooling agent.

11. The cooling device according to claim 1, further comprising an additional evaporator comprising a top part, a bottom part, and a plurality of evaporating tubes connecting the top part with the bottom part, wherein the top part of the additional evaporator is connected to the bottom part of the evaporator by a first evaporator connecting line of the cooling device, and wherein the bottom part of the additional evaporator is connected to the compressor by the third fluid line, so that during the active cooling mode lubricant oil is adapted to be transferred from the bottom part of the evaporator through the first evaporator connecting line, through the top part of the additional evaporator, through the evaporating tubes of the additional evaporator, through the bottom part of the additional evaporator, and through the third fluid line back to the compressor.

12. The cooling device according to claim 11, further comprising a second evaporator connecting line, which connects the top part of the additional evaporator with the second by-pass valve of the second fluid by-pass line.

13. The cooling device according to claim 12, wherein the second by-pass valve is formed as a three-way by-pass valve, which comprises a first valve inlet connected to the top part of the evaporator by a first section of the second fluid by-pass line, a second valve inlet connected to the top part of the additional evaporator by the second evaporator connecting line, and a valve outlet connected to the condensing unit by a second section of the second fluid by-pass line, and a moveable valve body adapted to close the first valve inlet, the second valve inlet and the valve outlet in the active cooling mode, and adapted to open the first valve inlet, the second valve inlet and the valve outlet in the passive cooling mode, in order to connect the first valve inlet and the second valve inlet with the first valve outlet.

14. The cooling device according to claim 11, wherein the first by-pass valve of the cooling device is formed as a three-way by-pass valve comprising a valve inlet connected to the condensing unit by a first section of the first fluid by-pass line, a first valve outlet connected to the bottom part of the evaporator by a second section of the first fluid by-pass line and a second valve outlet connected to the bottom part of the additional evaporator by a third evaporator connecting line.

15. The cooling device according to claim 11, wherein the first by-pass valve of the cooling device is formed as a four-way by-pass valve comprising a valve inlet connected to the condensing unit by a first section of the second fluid line, a first valve outlet connected to the bottom part of the evaporator by the first fluid by-pass line, a second valve outlet connected to the bottom part of the additional evaporator by a third evaporator connecting line, and a third valve outlet connected to the top part of the evaporator by a second section of the second fluid line.

16. The cooling device according to claim 15, wherein the four-way by-pass valve comprises a moveable valve body adapted to close the first valve outlet and the second valve outlet, while at the same time opening the valve inlet and third valve outlet, in the active cooling mode, and wherein the moveable valve body is adapted to close the third valve outlet, while at the same time opening the valve inlet, the first valve outlet and the second valve outlet, in the passive cooling mode.

17. The cooling device according to claim 1, wherein the second part of the evaporator and/or additional evaporator comprises a collecting portion, respectively connected by the plurality of evaporating tubes of the evaporator and/or additional evaporator with the first part of the evaporator and/or additional evaporator, wherein the collecting portion comprises a separating element, which separates a lower part of the collecting portion from an upper part of the collecting portion, wherein the upper part is connected to the plurality of evaporating tubes, wherein between the separating element and a wall of the collecting portion at least one opening is formed for conducting cooling agent from the lower part to the upper part of the collecting portion during a passive cooling mode.

18. The cooling device according to claim 17, wherein in the active cooling mode cooling agent is adapted to flow from the first part of the evaporator and/or additional evaporator through the plurality of evaporating tubes, to the upper part of the collecting portion, and wherein in the passive cooling mode cooling agent is adapted to flow from the lower part of the collecting portion, through the at least one opening, through the upper part of the collecting portion and through the plurality of evaporating tubes into the first part of the evaporator and/or additional evaporator.

19. The cooling device according to claim 17, wherein the separating element comprises a recess adapted to convey lubricant oil in the active cooling mode from the recess into an oil receiving portion of the collecting portion.

20. A method for cooling by using a cooling device, wherein the cooling device comprises a compressor; a condensing unit connected to the compressor by a first fluid line of the cooling device; an evaporator comprising a first part, a second part, and a plurality of evaporating tubes connecting the first part with the second part, wherein the first part is connected to the condensing unit by a second fluid by-pass line of the cooling device, and wherein the second part is connected to the compressor by a third fluid line, and a first fluid by-pass line of the cooling device, wherein the first fluid by-pass line connects the condensing unit with the second part of the evaporator, wherein the first fluid by-pass line comprises a first by-pass valve, and wherein the second fluid by-pass line comprises a second by-pass valve and wherein the second fluid by-pass line is oriented vertically in the cooling device, the method comprising:

closing of the first fluid by-pass line in an active cooling mode by the first by-pass valve, closing of the second fluid by-pass line in the active cooling mode by the second by-pass valve, compressing cooling agent present in the cooling device during the active cooling mode by the compressor, wherein the compressed cooling agent contains lubricant oil from the compressor, transferring lubricant oil from the compressor through the condensing unit, through the evaporator and through the third fluid line back to the compressor in the active cooling mode, and separating the lubricant oil from compressed gaseous cooling agent by gravity, wherein the lubricant oil drops down in the vertically oriented second fluid by-pass line, and wherein the compressed gaseous cooling agent rises up in the vertically oriented second fluid by-pass line due to pressure applied to the compressed gaseous cooling agent by the compressor.

* * * * *